(12) United States Patent
Bao et al.

(10) Patent No.: US 10,586,854 B2
(45) Date of Patent: Mar. 10, 2020

(54) GATE-ALL-AROUND FIELD EFFECT TRANSISTOR HAVING MULTIPLE THRESHOLD VOLTAGES

(71) Applicant: International Business Machines Corporation, Armonk, NY (US)

(72) Inventors: Ruqiang Bao, Niskayuna, NY (US); Michael A. Guillorn, Cold Springs, NY (US); Terence Hook, Jericho, VT (US); Robert R. Robison, Colchester, VT (US); Reinaldo Vega, Mahopac, NY (US); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/975,869

(22) Filed: May 10, 2018

(65) Prior Publication Data

US 2018/0308945 A1 Oct. 25, 2018

Related U.S. Application Data

(63) Continuation of application No. 15/398,225, filed on Jan. 4, 2017, now Pat. No. 10,128,347.

(51) Int. Cl.
| | | |
|---|---|---|
| *H01L 29/423* | (2006.01) | |
| *H01L 29/66* | (2006.01) | |
| *H01L 29/78* | (2006.01) | |
| *H01L 29/49* | (2006.01) | |
| *H01L 29/06* | (2006.01) | |

(Continued)

(52) U.S. Cl.
CPC ........ *H01L 29/42392* (2013.01); *B82Y 10/00* (2013.01); *H01L 29/0653* (2013.01); *H01L 29/0673* (2013.01); *H01L 29/495* (2013.01); *H01L 29/4966* (2013.01); *H01L 29/6656* (2013.01); *H01L 29/66439* (2013.01); *H01L 29/66545* (2013.01); *H01L 29/66795* (2013.01); *H01L 29/775* (2013.01); *H01L 29/785* (2013.01); *H01L 29/78696* (2013.01)

(58) Field of Classification Search
CPC .......... H01L 29/42392; H01L 29/0673; H01L 29/0653; H01L 29/775; H01L 29/66439; H01L 29/495; H01L 29/66795; H01L 29/785; H01L 29/66545; H01L 29/6656; H01L 29/4966; B82Y 10/00
See application file for complete search history.

(56) References Cited

U.S. PATENT DOCUMENTS

| | | |
|---|---|---|
| 8,728,885 B1 | 5/2014 | Pham |
| 9,412,849 B1 | 8/2016 | Suk |

(Continued)

*Primary Examiner* — Bitew A Dinke
(74) *Attorney, Agent, or Firm* — Tutunjian & Bitetto, P.C.; Vazken Alexanian

(57) ABSTRACT

One example of an apparatus includes a conducting channel region. The conducting channel region includes a plurality of epitaxially grown, in situ doped conducting channels arranged in a spaced apart relation relative to each other. A source positioned at a first end of the conducting channel region, and a drain positioned at a second end of the conducting channel region. A gate surrounds all sides of the conducting channel region and fills in spaces between the plurality of epitaxially grown, in situ doped conducting channels.

19 Claims, 16 Drawing Sheets

(51) Int. Cl.
  *H01L 29/775* (2006.01)
  *B82Y 10/00* (2011.01)
  *H01L 29/786* (2006.01)

(56) References Cited

U.S. PATENT DOCUMENTS

| | | |
|---|---|---|
| 9,698,241 B1 | 7/2017 | Patil |
| 9,755,017 B1 | 9/2017 | Guillorn |
| 10,128,347 B2 * | 11/2018 | Bao .................. H01L 29/42392 |
| 2005/0158934 A1 | 7/2005 | Yun |
| 2010/0155827 A1 | 6/2010 | Kim |
| 2010/0258878 A1 * | 10/2010 | Mise ................. H01L 21/28194 257/369 |
| 2010/0317185 A1 * | 12/2010 | Vos ..................... H01L 21/0206 438/591 |
| 2012/0025327 A1 * | 2/2012 | Ji .................... H01L 21/823462 257/411 |
| 2012/0119204 A1 | 5/2012 | Wong |
| 2013/0105905 A1 * | 5/2013 | Ji ...................... H01L 21/28202 257/369 |
| 2013/0307053 A1 * | 11/2013 | Polishchuk ......... H01L 29/4234 257/325 |
| 2015/0035071 A1 | 2/2015 | Ching |
| 2015/0091091 A1 | 4/2015 | Liu |
| 2015/0179798 A1 * | 6/2015 | Clendenning ....... H01L 29/7851 257/401 |
| 2015/0228480 A1 | 8/2015 | Yin |
| 2015/0243733 A1 * | 8/2015 | Yang .................. H01L 29/0673 257/401 |
| 2015/0295036 A1 | 10/2015 | Hong |
| 2015/0295084 A1 | 10/2015 | Obradovic |
| 2015/0303115 A1 * | 10/2015 | Liu ................... H01L 21/82345 257/392 |
| 2015/0357244 A1 * | 12/2015 | Ragnarsson ...... H01L 21/28088 438/275 |
| 2016/0027870 A1 * | 1/2016 | Cheng ................ H01L 29/0673 257/347 |
| 2016/0056236 A1 | 2/2016 | Ching |
| 2016/0111513 A1 | 4/2016 | Liu |
| 2016/0247893 A1 | 8/2016 | Xu |
| 2016/0315167 A1 | 10/2016 | Nakamura |
| 2016/0365411 A1 | 12/2016 | Yeh |
| 2017/0005176 A1 | 1/2017 | Sung |
| 2017/0025314 A1 | 1/2017 | Witte |
| 2017/0200738 A1 * | 7/2017 | Kim .................... H01L 27/1203 |
| 2017/0222024 A1 | 8/2017 | Bergendahl |
| 2017/0256544 A1 * | 9/2017 | Chai ................. H01L 21/30604 |
| 2017/0287788 A1 | 10/2017 | Doris |
| 2017/0288018 A1 | 10/2017 | Tung |
| 2017/0365679 A1 | 12/2017 | None |
| 2018/0069006 A1 * | 3/2018 | Kim .................. H01L 21/02603 |
| 2018/0130905 A1 * | 5/2018 | Chung ................ H01L 29/4908 |

* cited by examiner

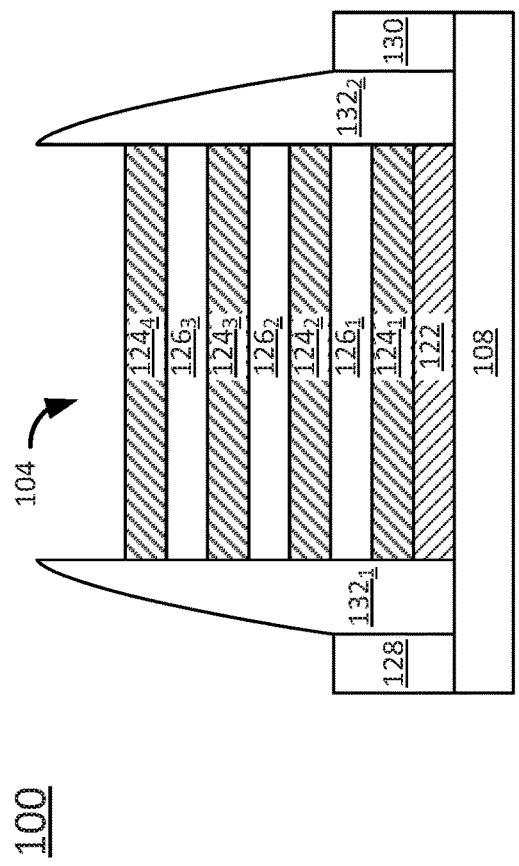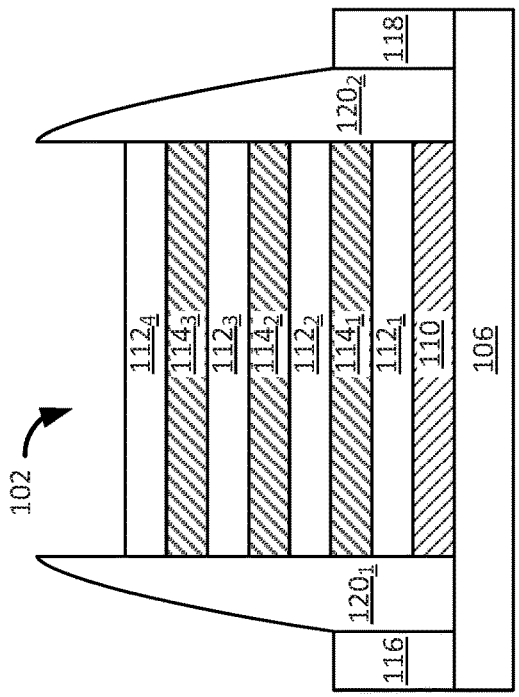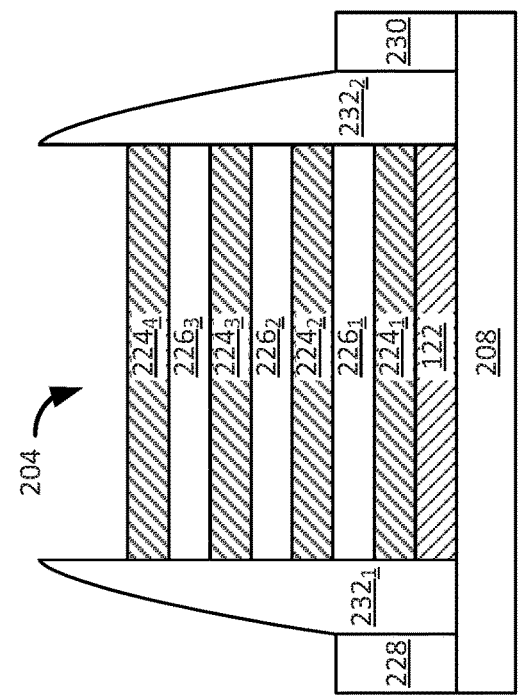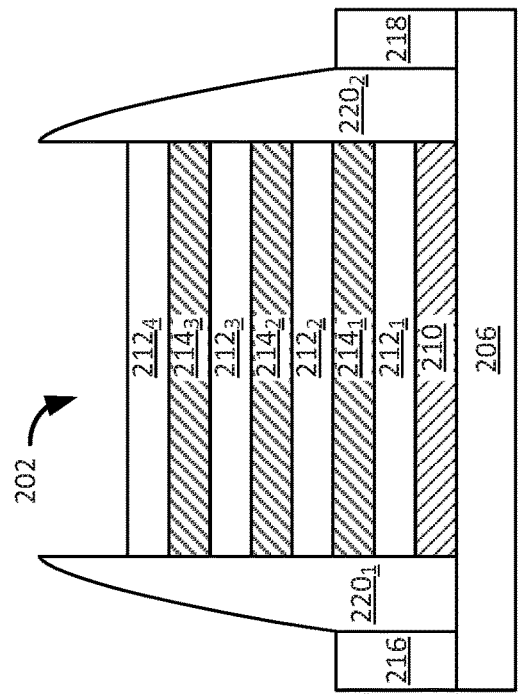
FIG. 1A
FIG. 2A

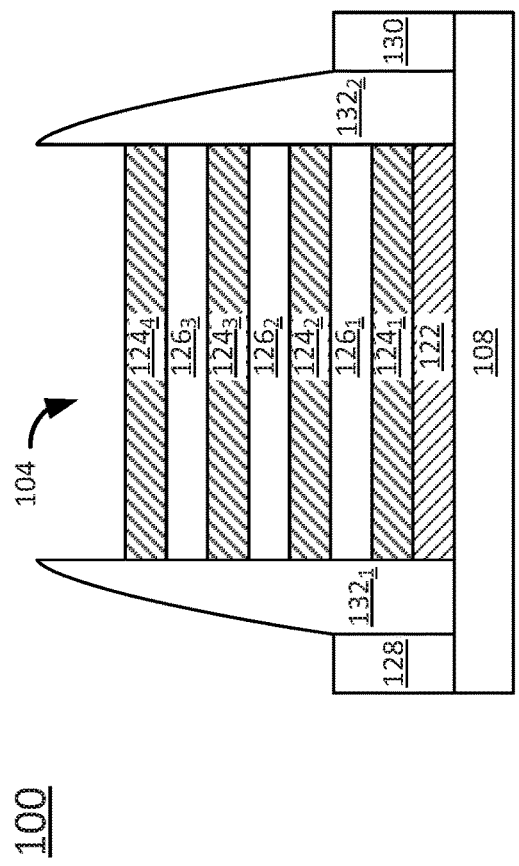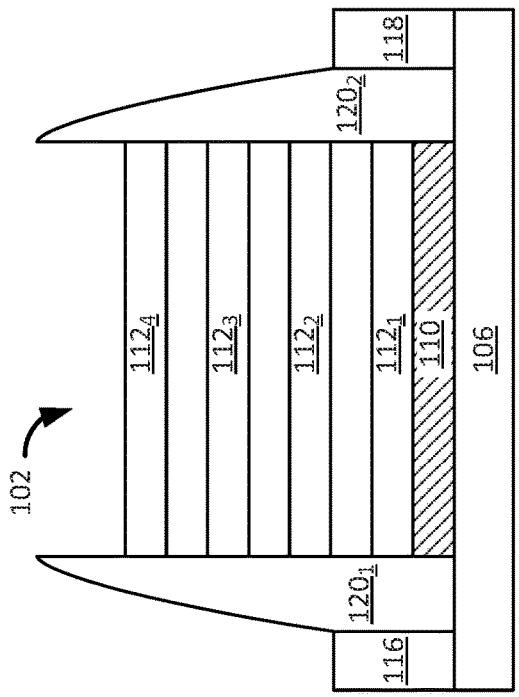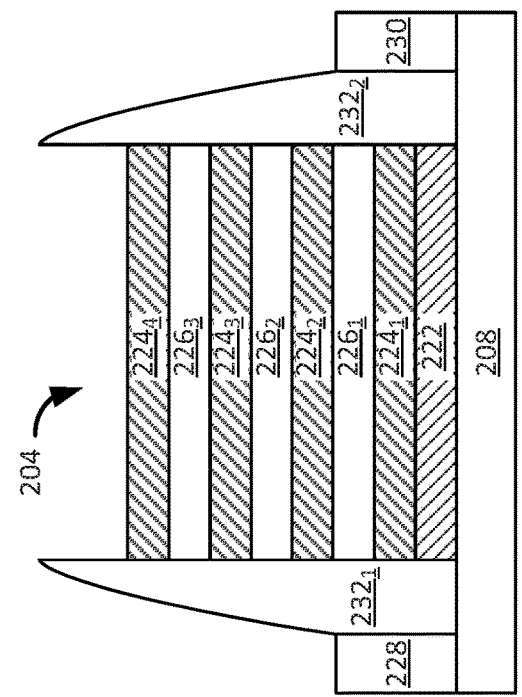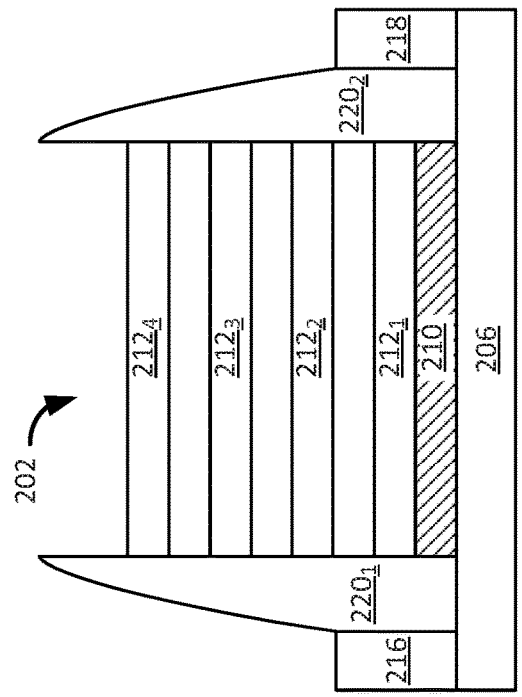
FIG. 1B
FIG. 2B

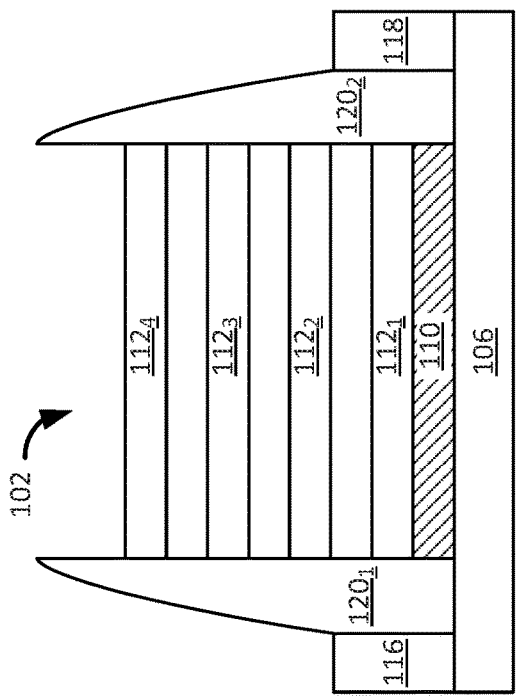
FIG. 1C
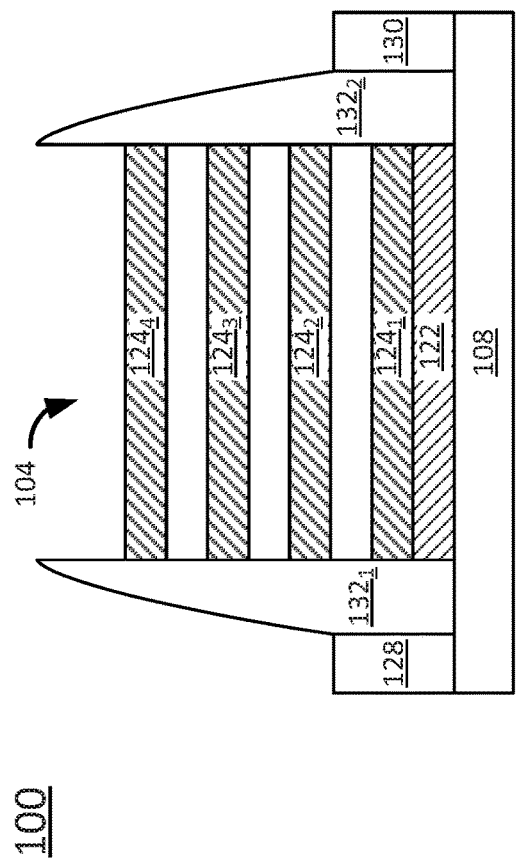
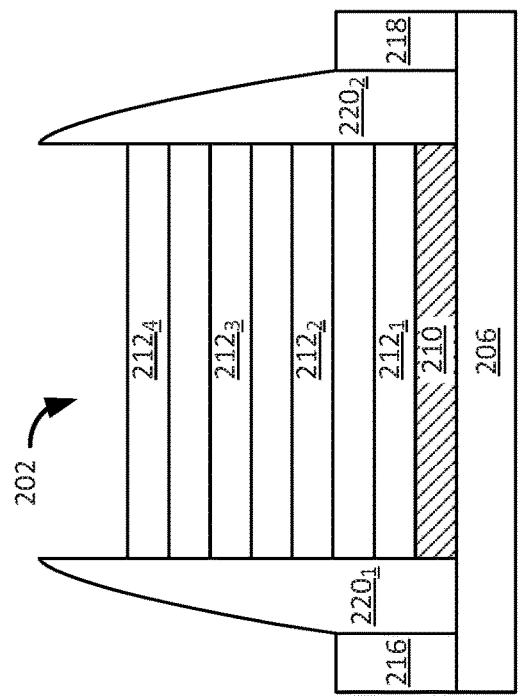
FIG. 2C
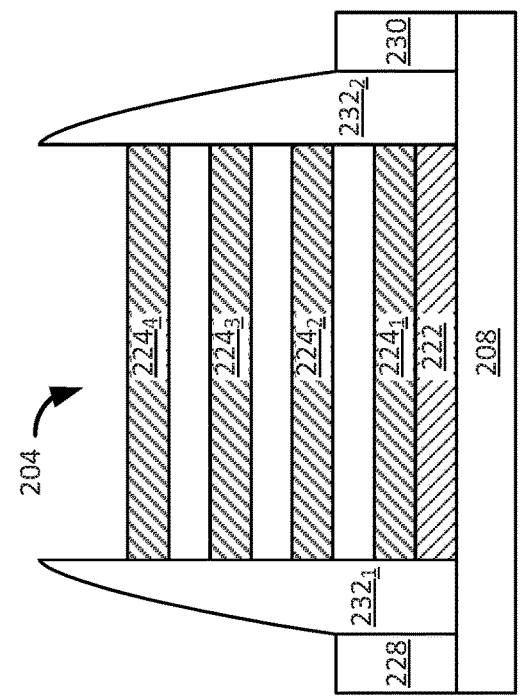

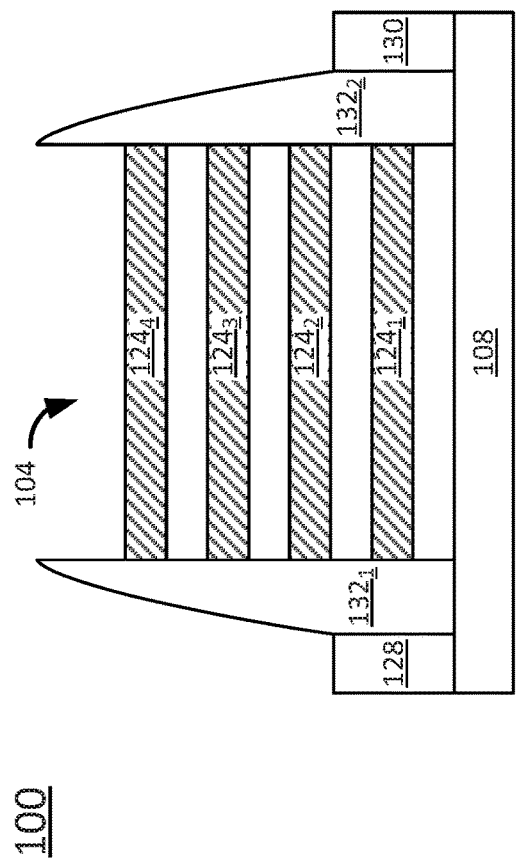
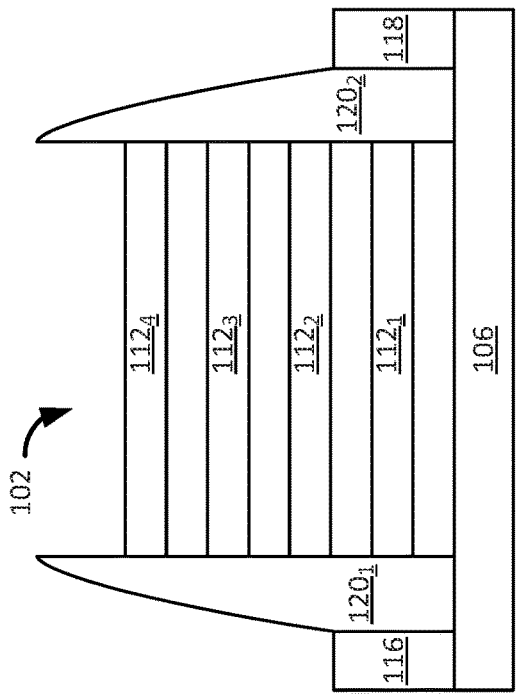
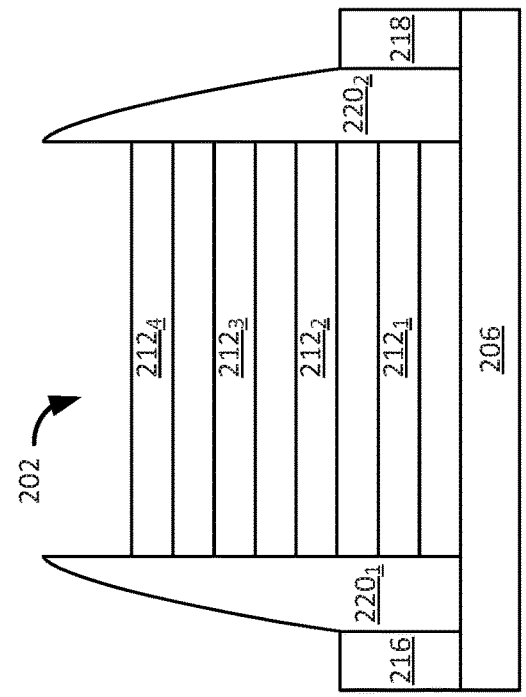
FIG. 1D
FIG. 2D

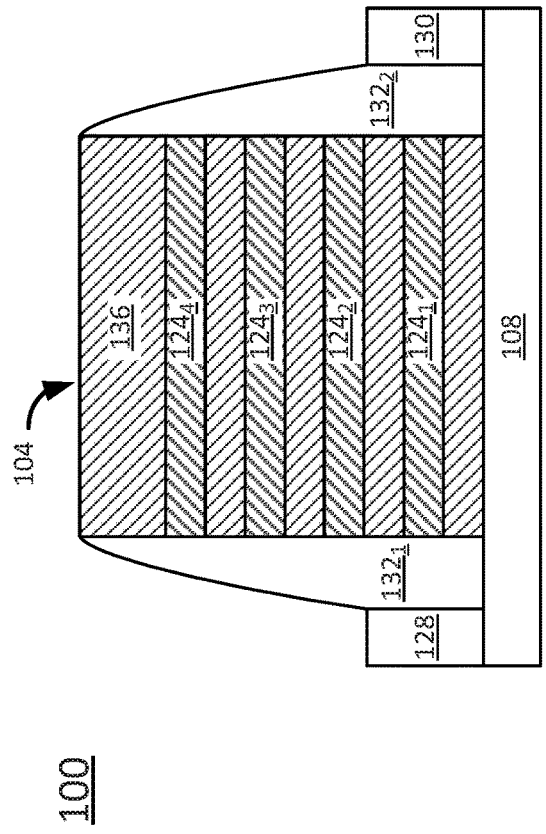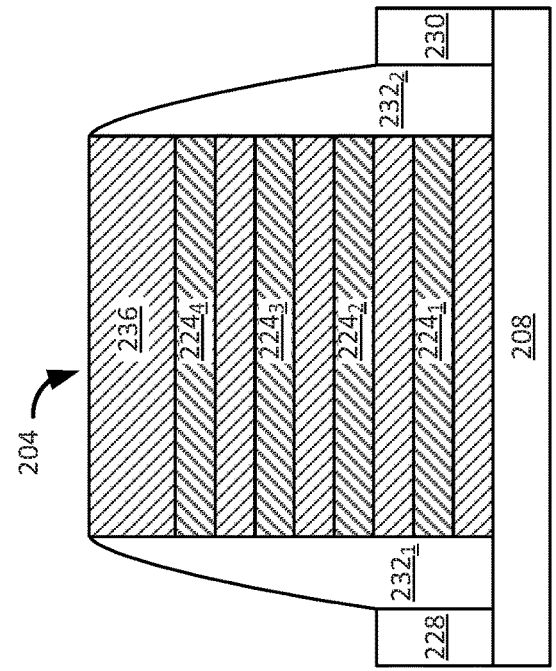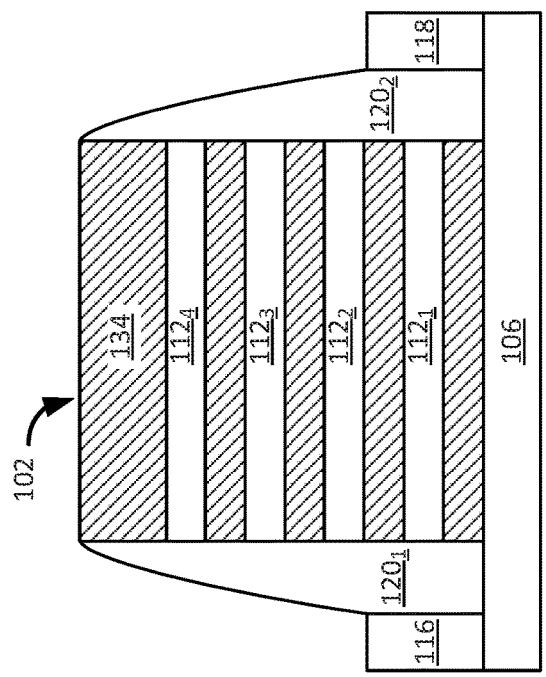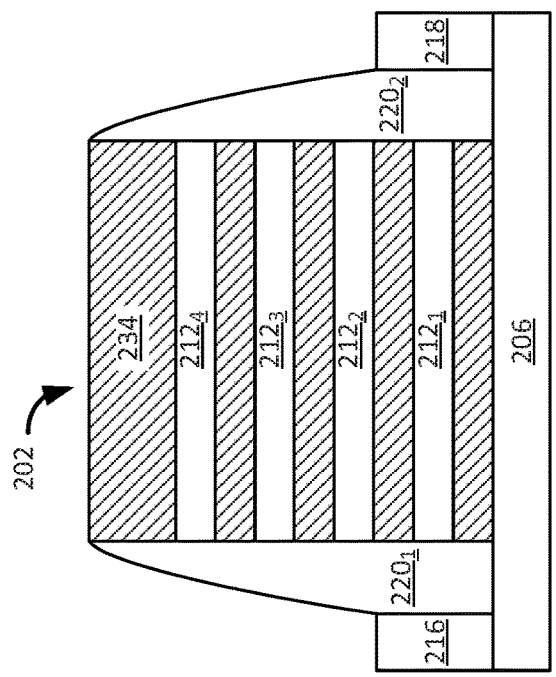

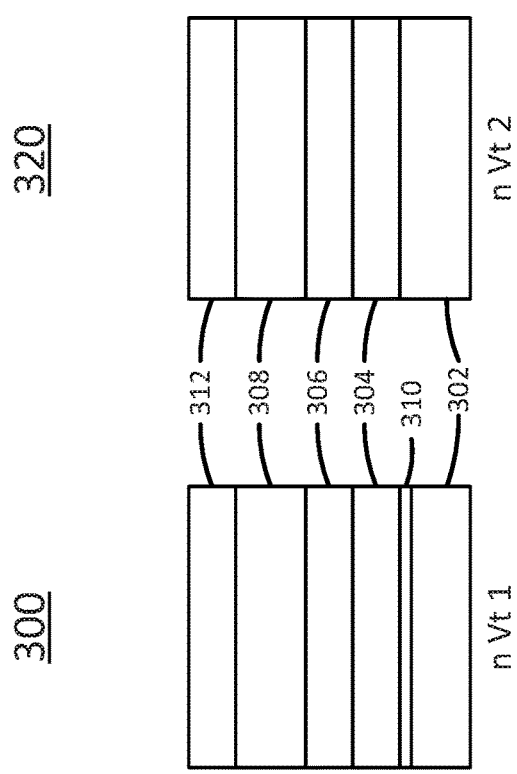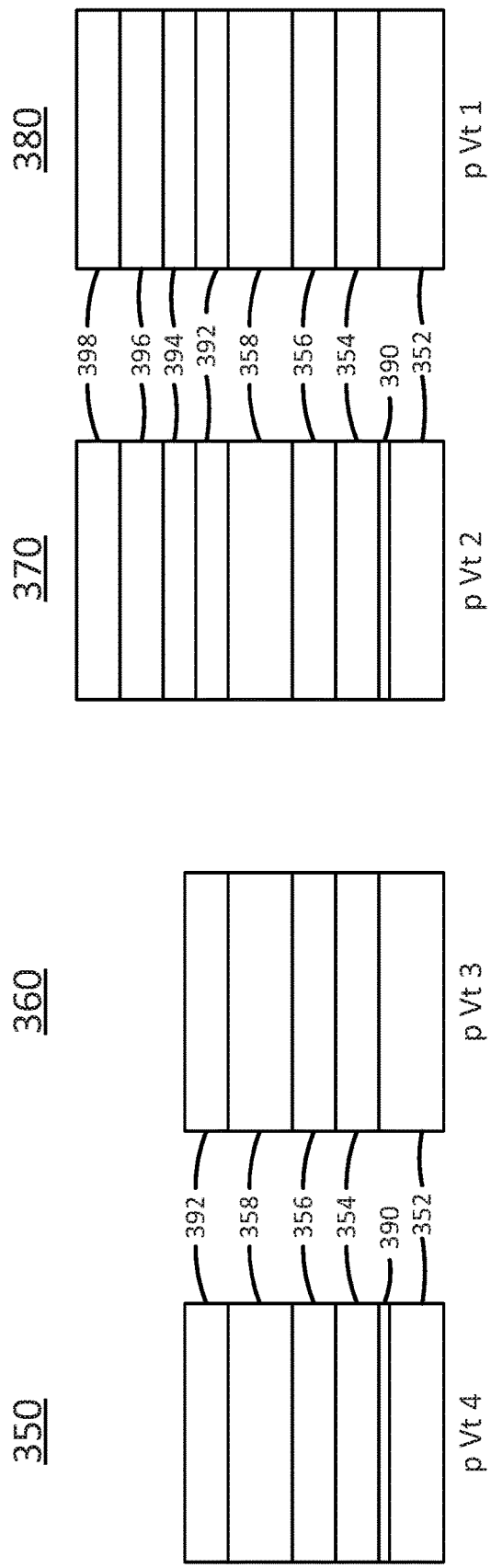
FIG. 3A
FIG. 3B

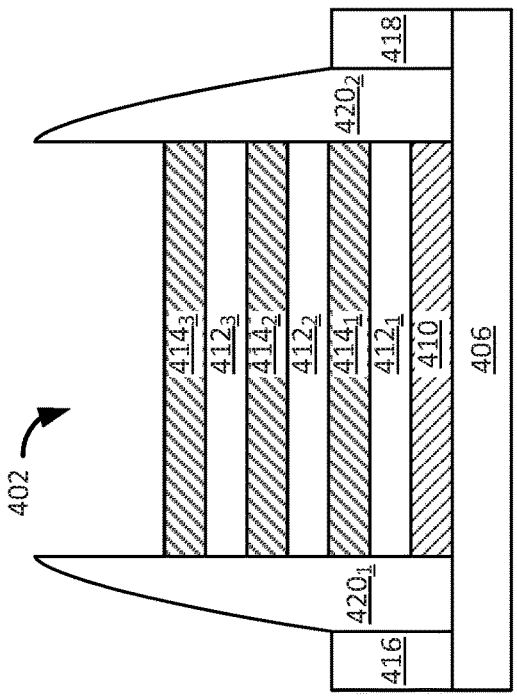
FIG. 4A
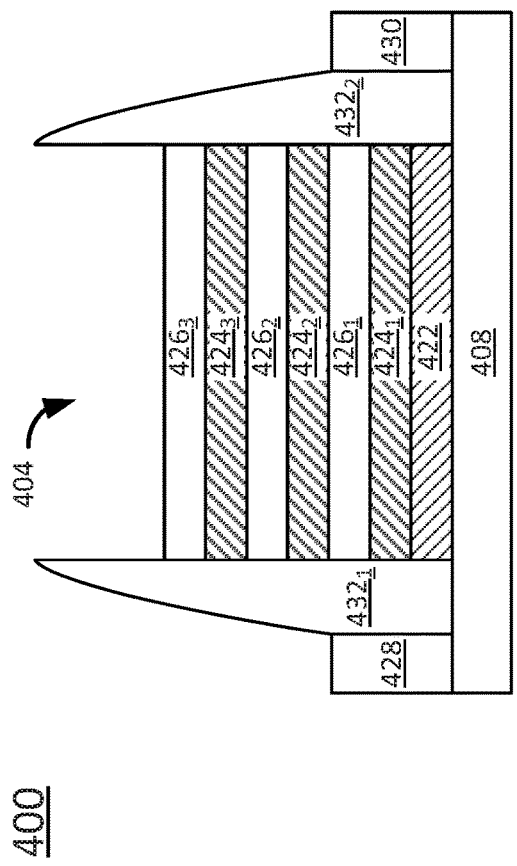
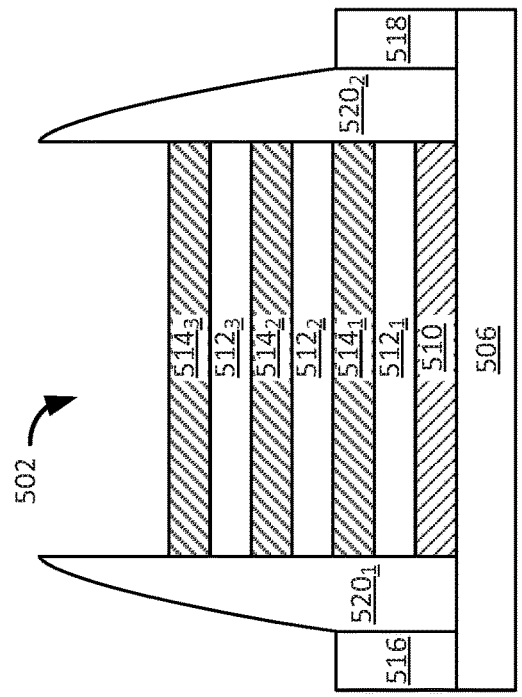
FIG. 5A
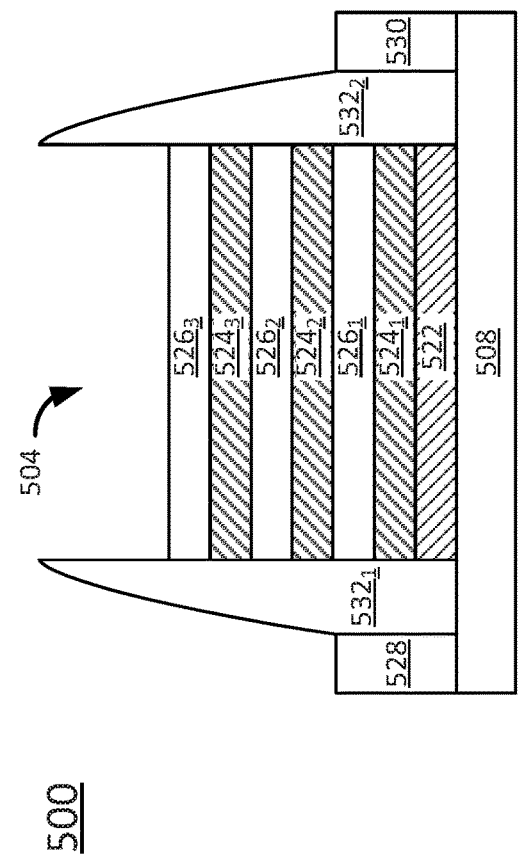

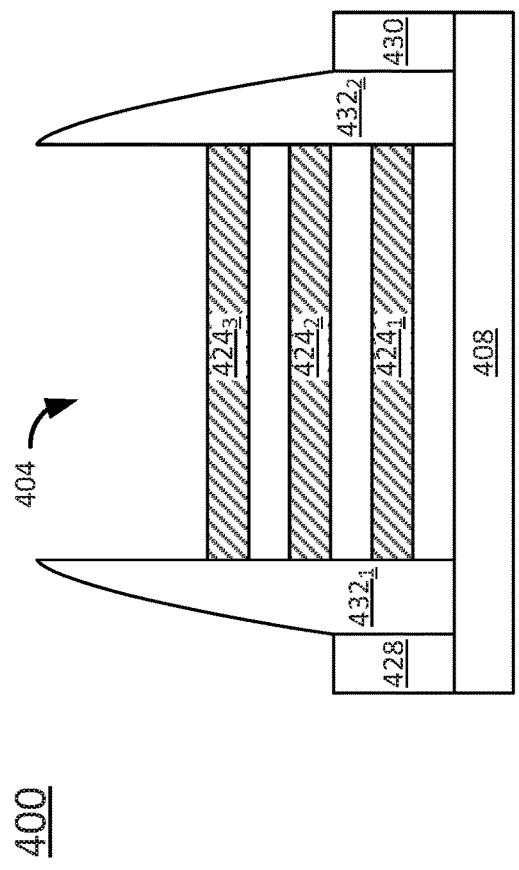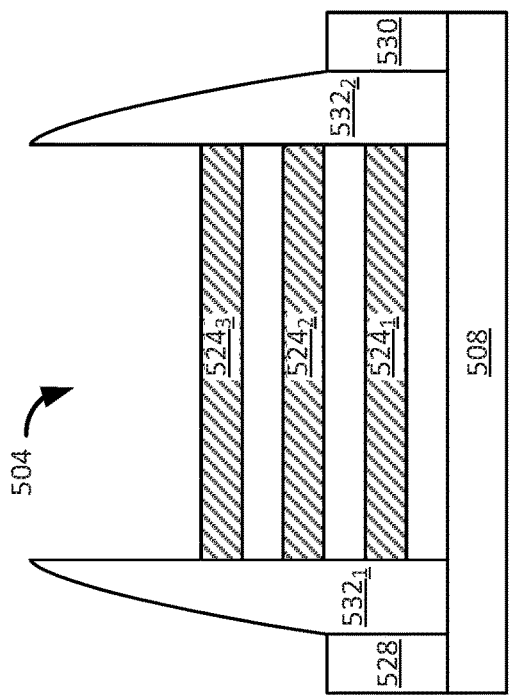
FIG. 4D
FIG. 5D
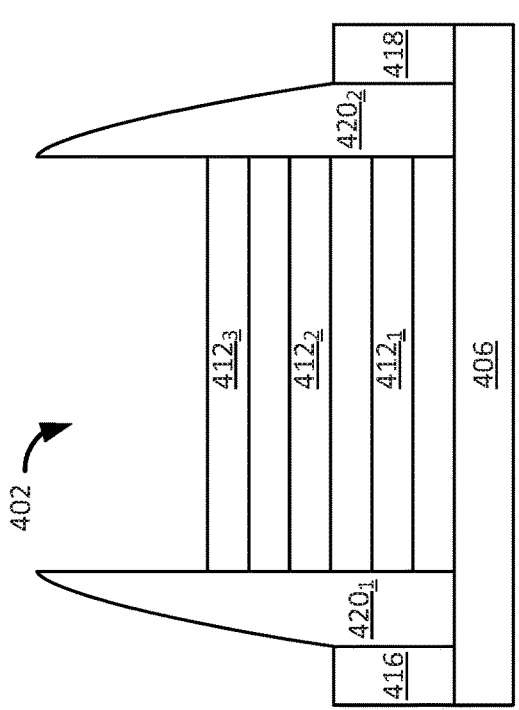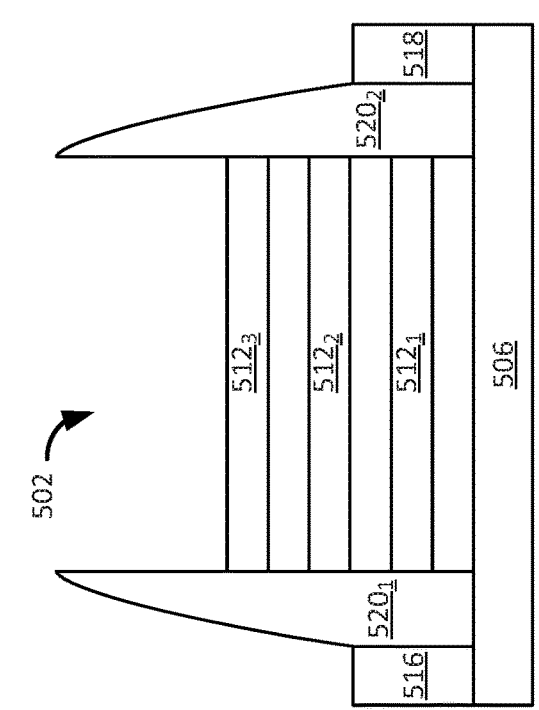

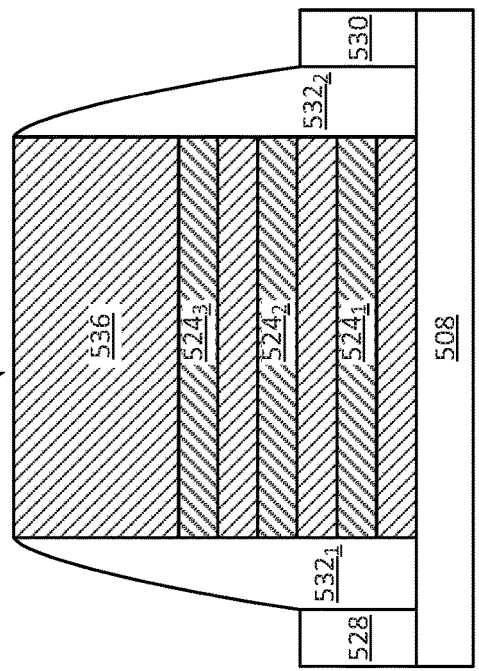
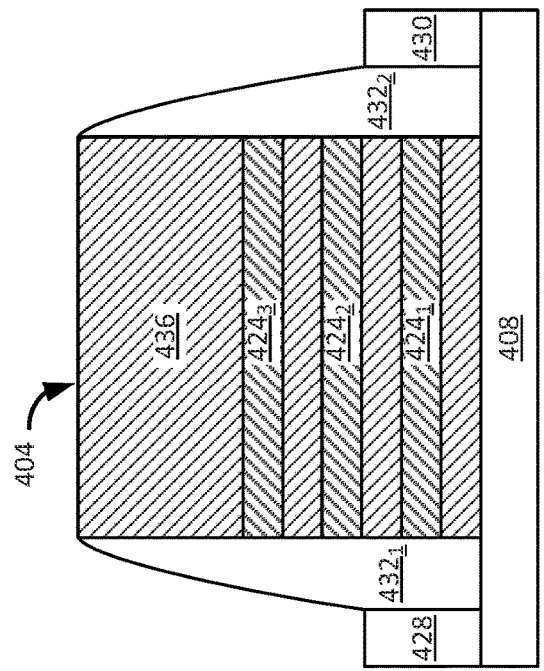
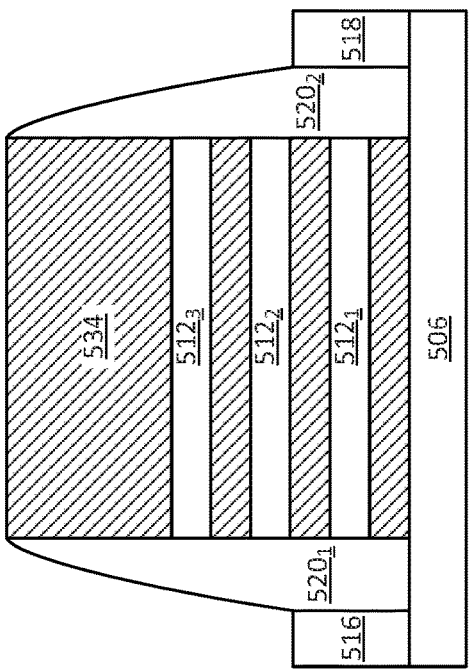
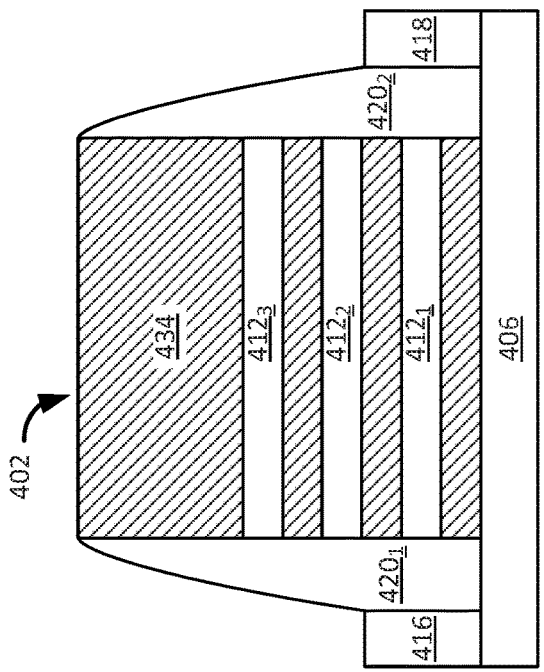
FIG. 4E
FIG. 5E

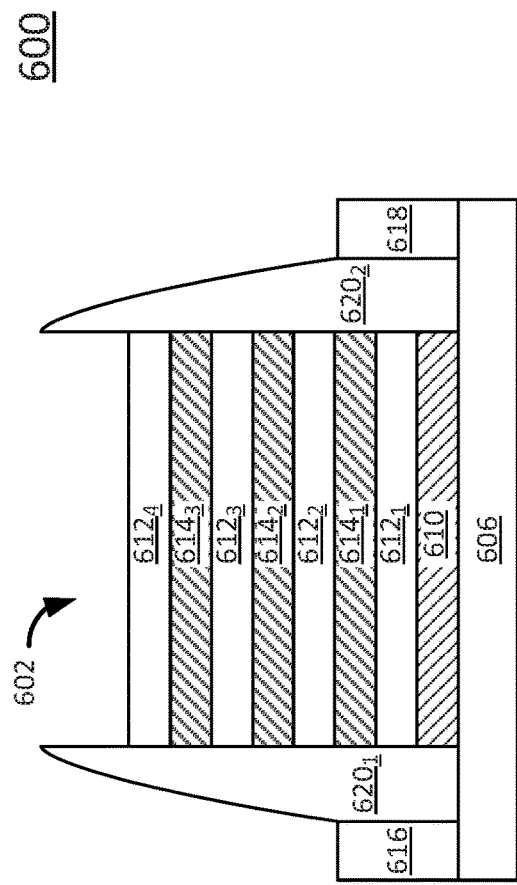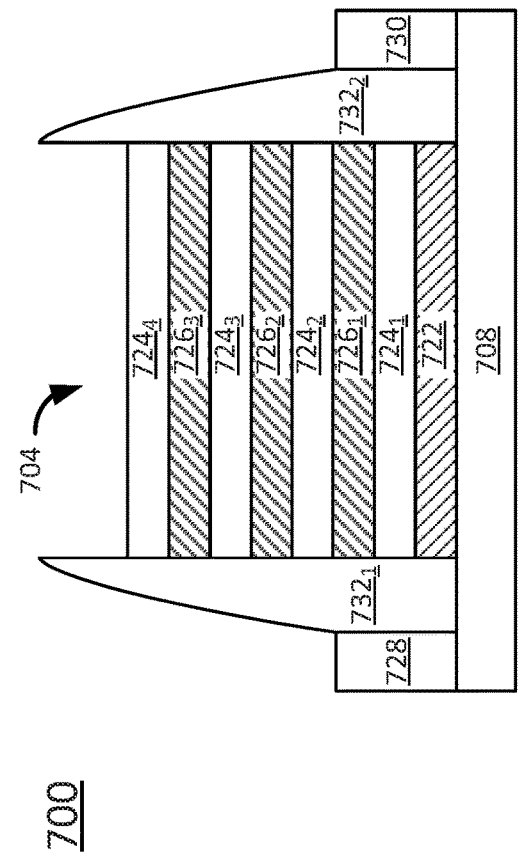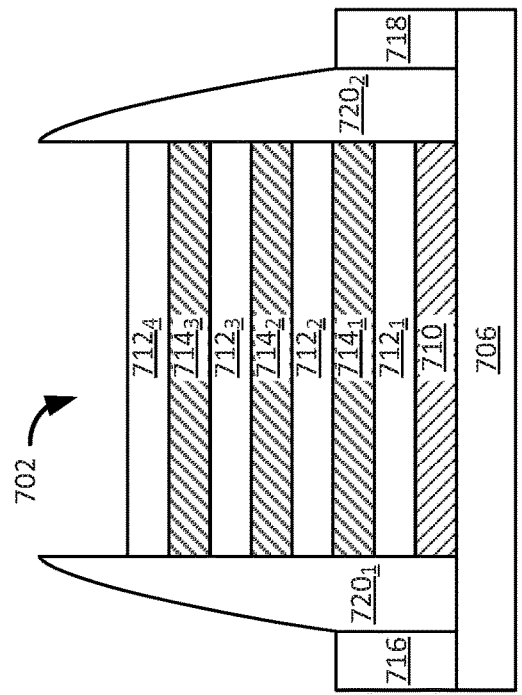

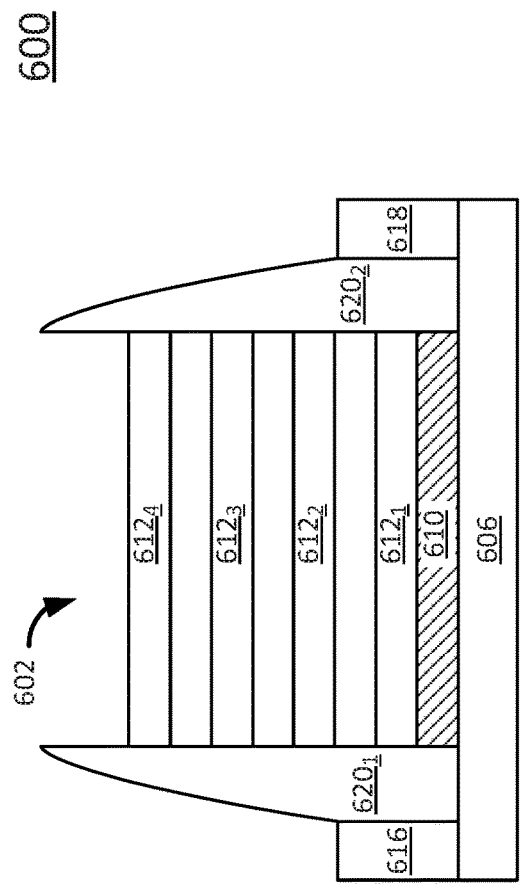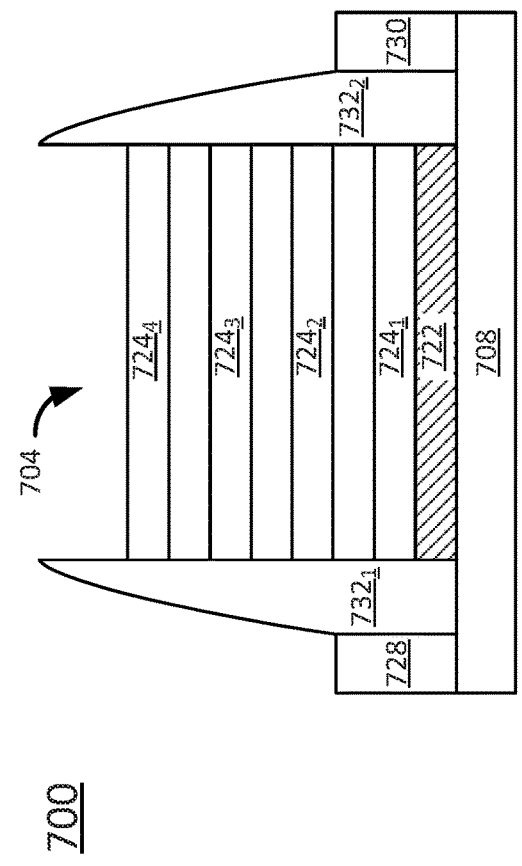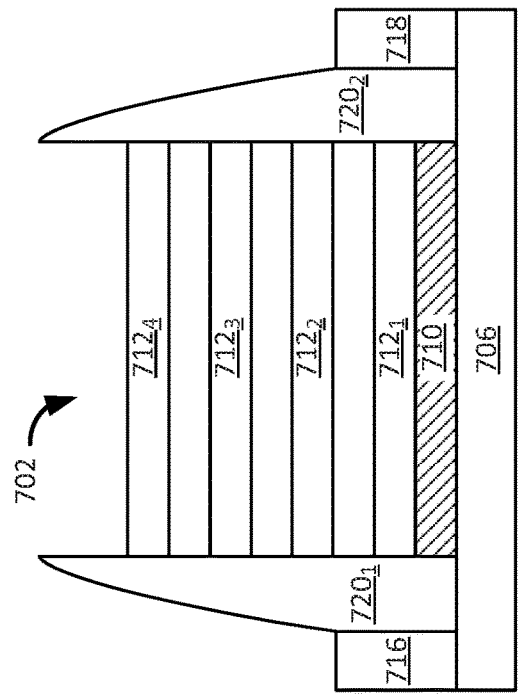
FIG. 6B
FIG. 7B

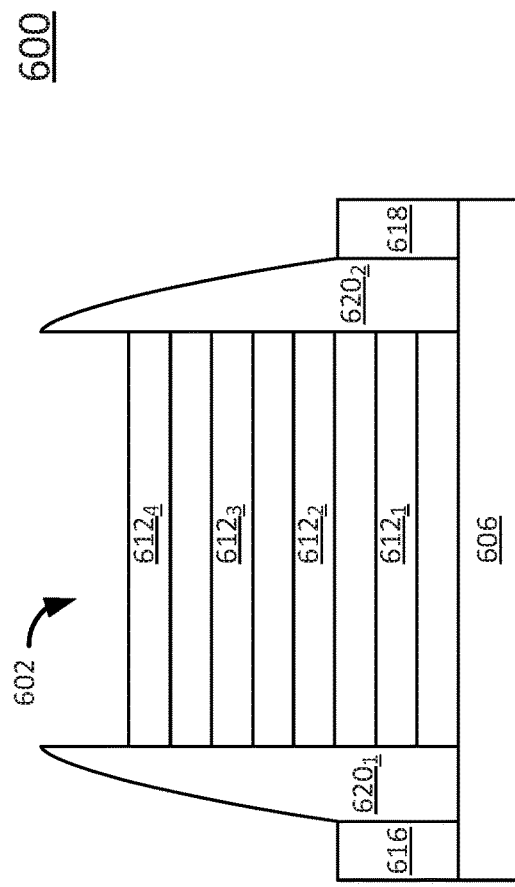
FIG. 6C
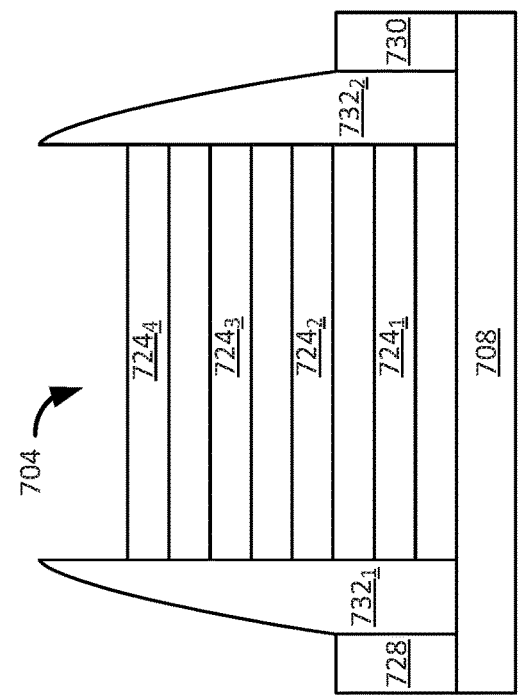
FIG. 7C
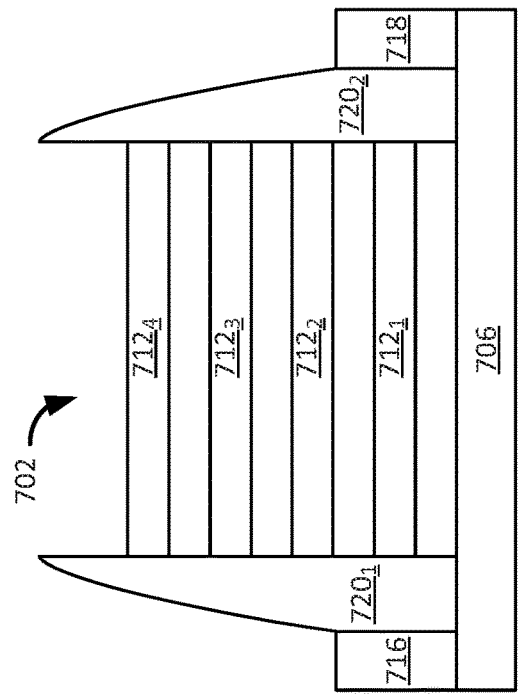

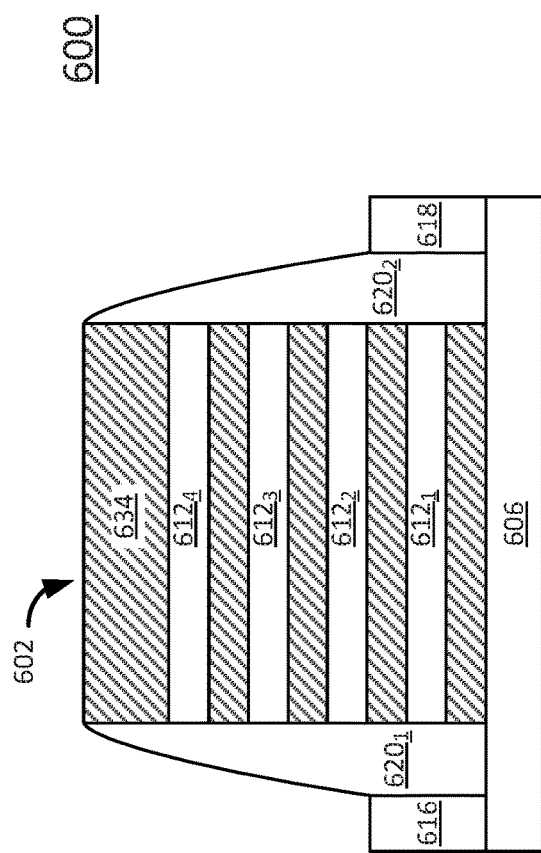
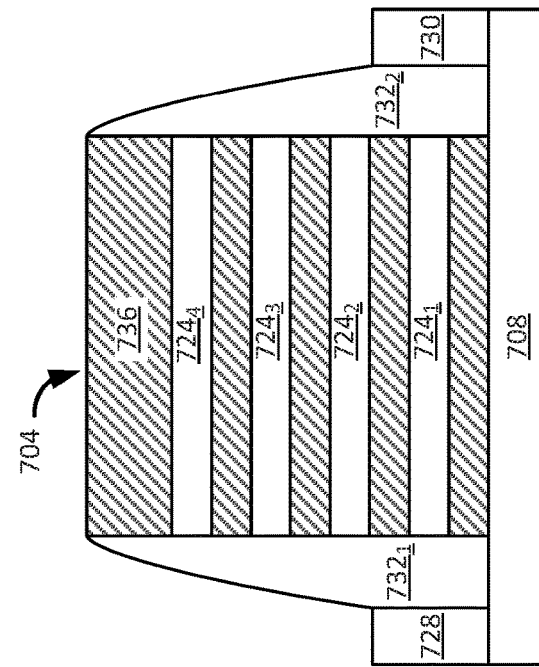
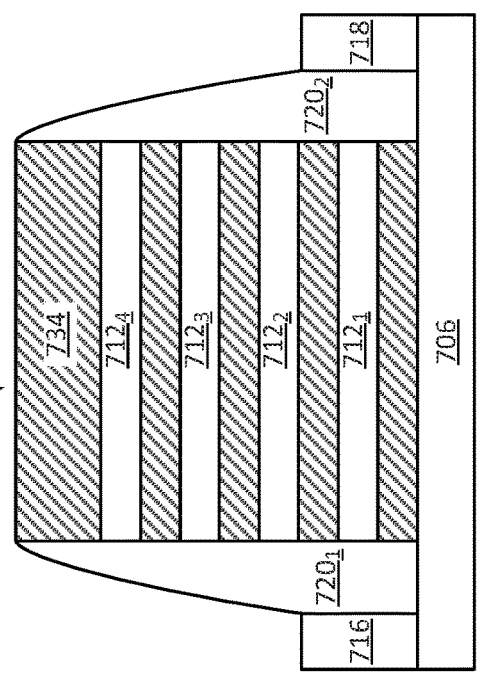
FIG. 6D
FIG. 7D

US 10,586,854 B2

GATE-ALL-AROUND FIELD EFFECT TRANSISTOR HAVING MULTIPLE THRESHOLD VOLTAGES

FIELD OF THE DISCLOSURE

The present disclosure relates generally to semiconductor devices and relates more specifically to gate-all-around field effect transistors.

BACKGROUND OF THE DISCLOSURE

Multiple gate field effect transistors (FETs) are metal-oxide-semiconductor field effect transistors (MOSFETs) that incorporate more than one gate into a single device.

One specific type of multiple gate FET is the finFET, which wraps the conducting channel with a thin fin forming the gate of the device. The effective channel length of the device in this case is determined by the thickness of the fin (measured from source to drain). The wrap-around structure of the gate provides improved electrical control over the channel, and thus helps to mitigate leakage current and other short-channel effects. However, as the fin width approaches five nanometers or greater, channel width variations in the finFET may cause variability and mobility loss These effects can be mitigated by forming the FET as a gate-all-around (GAA) FET, which is similar to the finFET, except that the gate material surrounds the channel region on all sides. GAA FETs provide a static electrical field from all directions.

SUMMARY OF THE DISCLOSURE

One example of an apparatus includes a conducting channel region. The conducting channel region includes a plurality of epitaxially grown, in situ doped conducting channels arranged in a spaced apart relation relative to each other. A source positioned at a first end of the conducting channel region, and a drain positioned at a second end of the conducting channel region. A gate surrounds all sides of the conducting channel region and fills in spaces between the plurality of epitaxially grown, in situ doped conducting channels.

One example of a method includes growing a conducting channel region between a source and a drain, wherein the conducting channel region comprises a plurality of conducting channels arranged in a spaced apart relation relative to each other. The plurality of conducting channels are doped in situ, and a gate is deposited around all sides of the conducting channel region.

In another example, an apparatus includes an n-type field effect transistor and a p-type field effect transistor. The n-type field effect transistor includes a first conducting channel region including a plurality of epitaxially grown, in situ doped silicon channels arranged in a spaced apart relation relative to each other, a first source positioned at a first end of the first conducting channel region, a first drain positioned at a second end of the first conducting channel region, and a first gate surrounding all sides of the first conducting channel region and filling in spaces between the plurality of epitaxially grown, in situ doped silicon channels. The p-type field effect transistor includes a second conducting channel region including a plurality of epitaxially grown, in situ doped silicon germanium channels arranged in a spaced apart relation relative to each other, a first second positioned at a first end of the second conducting channel region, a second drain positioned at a second end of the second conducting channel region, and a second gate surrounding all sides of the second conducting channel region and filling in spaces between the plurality of epitaxially grown, in situ doped silicon germanium channels.

BRIEF DESCRIPTION OF THE DRAWINGS

The teachings of the present disclosure can be readily understood by considering the following detailed description in conjunction with the accompanying drawings, in which:

FIGS. 1A-1E illustrate cross sectional views of a first field effect transistor during various stages of a fabrication process performed according to examples of the present disclosure;

FIGS. 2A-2E illustrate cross sectional views of a second field effect transistor during various stages of a fabrication process performed according to examples of the present disclosure;

FIG. 3A illustrates example gate stacks that may be fabricated to achieve four n-type field effect transistor threshold voltages without metal doping devices for a dual work function gate stack;

FIG. 3B illustrates example gate stacks that may be fabricated to achieve four p-type field effect transistor threshold voltages without metal doping devices for a dual work function gate stack;

FIGS. 4A-4E illustrate cross sectional views of a third field effect transistor during various stages of a fabrication process performed according to examples of the present disclosure;

FIGS. 5A-5E illustrate cross sectional views of a fourth field effect transistor 500 during various stages of a fabrication process performed according to examples of the present disclosure;

FIGS. 6A-6D illustrate cross sectional views of a fifth field effect transistor during various stages of a fabrication process performed according to examples of the present disclosure; and FIGS. 7A-7D illustrate cross sectional views of a sixth field effect transistor during various stages of a fabrication process performed according to examples of the present disclosure.

To facilitate understanding, identical reference numerals have been used, where possible, to designate identical elements that are common to the Figures.

DETAILED DESCRIPTION

Figure 3C:
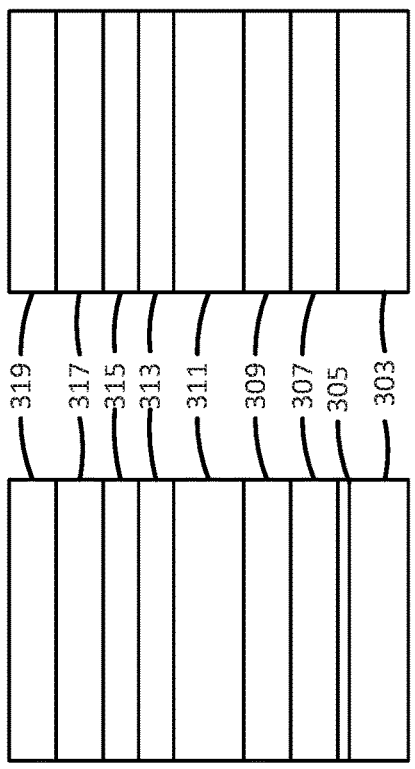
FIG. 3C illustrates example gate stacks that may be fabricated to achieve four n-type field effect transistor threshold voltages with metal doping devices for a dual work function gate stack.

In one example, a gate-all-around (GAA) field effect transistor (FET) having multiple threshold voltages is disclosed. As discussed above, a GAA FET can provide a static electrical field from all directions, thus mitigating some of the shortcomings associated with the scaling of finFETs. However, certain forms of GAA FETs, such as nanosheets (i.e., two-dimensional nanostructures having a thickness in the range of one to one hundred nanometers) have complex structures that make it difficult to successfully achieve the uniform channel doping that makes modulation of the device's threshold voltage (Vt) possible. Moreover, the use of certain channel materials, including silicon germanium (SiGe), in combination with post-fabrication doping of the nanosheet may actually degrade device performance.

Examples of the present disclosure provide a GAA FET having multiple threshold voltages. In one particular example, uniform doping of the conducting channel (e.g., the region of the channel residing between the source and the drain) of the GAA FET is achieved by epitaxially doping the conducting channel in situ during fabrication of the channel. In a further example, a gate stack is disclosed from which up to eight n-type FET (nFET) threshold voltages and eight p-type FET (pFET) threshold voltages can be derived when the GAA FET includes dual channels (e.g., a silicon channel for the nFET and a silicon germanium channel for the pFET).

FIGS. 1A-1E illustrate cross sectional views of a first field effect transistor 100 during various stages of a fabrication process performed according to examples of the present disclosure. As such, when viewed in sequence, FIGS. 1A-1E also serve as a flow diagram for the fabrication process. In particular, FIGS. 1A-1E illustrate a process by which a dual-channel GAA FET may be fabricated using undoped conducting channels.

Referring to FIG. 1A, the first FET 100 comprises an nFET region 102 and a pFET region 104. The nFET region 102 comprises a substrate 106, formed, for example, from bulk silicon (Si) or silicon on insulator (SOI). In one example, the channel area of the nFET 102 region comprises a single base layer 110, formed, for example, from silicon germanium (SiGe) with a high germanium content deposited directly on the substrate 106. Deposited or epitaxially grown directly on the base layer 110 is a plurality of conducting layers $112_1$-$112_4$ (hereinafter collectively referred to as "conducting layers 112) and a plurality of sacrificial layers $114_1$-$114_3$ (hereinafter collectively referred to as "sacrificial layers 114"). The conducting layers 112 and the sacrificial layers 114 are arranged on the base layer 110 in an alternating manner, e.g., starting with a first conducting layer $112_1$ deposited or epitaxially grown directly on the base layer 110 and ending with a last conducting layer $114_4$. Thus, the sacrificial layers 114 are positioned to space the conducting layers 112 apart from each other. In one example, there are four conducting layers 112 and three sacrificial layers 114, although other numbers of layers are also possible.

The conducting layers 112 and the sacrificial layers 114 may be formed of different semiconductor materials. In one example, the conducting layers 112 comprise undoped silicon, while the sacrificial layers 114 comprise silicon germanium.

A source 116 is positioned at one end of the conducting channel region, while a drain 118 is positioned at the opposite end of the conducting channel region. Spacers $120_1$-$120_2$ (hereinafter collectively referred to as "spacers 120") are positioned between the conducting channel region and each of the source 116 and the drain 118.

The pFET region 104 comprises a substrate 108, formed, for example, from bulk silicon (Si) or silicon on insulator (SOI). In one example, the channel area of the pFET 104 region comprises a single base layer 122, formed, for example, from silicon germanium (SiGe) with a high germanium content deposited directly on the substrate 108. Deposited directly on the base layer 122 is a plurality of conducting layers $124_1$-$124_4$ (hereinafter collectively referred to as "conducting layers 124) and a plurality of sacrificial layers $126_1$-$126_3$ (hereinafter collectively referred to as "sacrificial layers 126"). The conducting layers 124 and the sacrificial layers 126 are arranged on the base layer 108 in an alternating manner, e.g., starting with a first conducting layer $124_1$ deposited directly on the base layer 108 and ending with a last conducting layer $124_4$. In one example, there are four conducting layers 124 and three sacrificial layers 126, although other numbers of layers are also possible.

The conducting layers 124 and the sacrificial layers 126 may be formed of different semiconductor materials. In one example, the conducting layers 124 comprise undoped silicon germanium, while the sacrificial layers 126 comprise silicon.

A source 128 is positioned at one end of the conducting channel region, while a drain 130 is positioned at the opposite end of the conducting channel region. Spacers $132_1$-$132_2$ (hereinafter collectively referred to as "spacers 132") are positioned between the conducting channel region and each of the source 128 and the drain 130.

Referring to FIG. 1B, the sacrificial layers 114 of the nFET region 102 are next removed, e.g., by wet and/or dry/plasma etching. This leaves the plurality of conducting layers 112 suspended between the source 116 and the drain 118. As discussed above, the plurality of conducting layers 112 may comprise undoped silicon.

Referring to FIG. 1C, the sacrificial layers 126 of the pFET region 104 are next removed, e.g., by wet and/or dry/plasma etching. This leaves the plurality of conducting layers 124 suspended between the source 128 and the drain 130. As discussed above, the plurality of conducting layers 124 may comprise undoped silicon germanium.

Referring to FIG. 1D, the base layers 110 and 122 of the nFET region 102 and the pFET region 104, respectively, may be removed, e.g., by wet and/or dry/plasma etching.

Referring to FIG. 1E, a metal gate layers 134 and 136 may be deposited in the nFET region 102 and the pFET region 104, respectively, in a replacement metal gate (RMG) or gate-last process. As illustrated, the metal gate layers 134 and 136 fill in the spaces between the respective conducting layers 112 and 124 and surround the respective conducting layers 112 and 124. In one example, the metal gate layers 134 and 136 surround the respective conducting layers 112 and 124 on all sides, creating gate-all-around structures in both the nFET region 102 and the pFET region 104. The nFET region 102 has a first n-type threshold voltage (nVt1), while the pFET region 104 has a first p-type threshold voltage (pVt1).

FIGS. 2A-2E illustrate cross sectional views of a second field effect transistor 200 during various stages of a fabrication process performed according to examples of the present disclosure. As such, when viewed in sequence, FIGS. 2A-2E also serve as a flow diagram for the fabrication process. In particular, FIGS. 2A-2E illustrate a process by which a dual-channel GAA FET may be fabricated using in situ doping of the conducting channels. The second FET 200 illustrated in FIGS. 2A-2E has a higher threshold voltage, both in the nFET region and the pFET region, than the first FET 100 illustrated in FIGS. 1A-1E. Furthermore, in the example illustrated in FIGS. 2A-2E, little or no counter doping is likely to occur between the conducting layers and sacrificial layers.

Referring to FIG. 2A, the first FET 200 comprises an nFET region 202 and a pFET region 204. The nFET region 202 comprises a substrate 206, formed, for example, from bulk silicon (Si) or silicon on insulator (SOI). In one example, the channel area of the nFET 202 region comprises a single base layer 210, formed, for example, from silicon germanium (SiGe) with a high germanium content deposited directly on the substrate 206. Deposited or epitaxially grown directly on the base layer 210 is a plurality of conducting layers $212_1$-$212_4$ (hereinafter collectively referred to as "conducting layers 212) and a plurality of sacrificial layers $214_1$-$214_3$ (hereinafter collectively referred to as "sacrificial layers 214"). The conducting layers 212 and the sacrificial layers 214 are arranged on the base layer 210 in an alternating manner, e.g., starting with a first conducting layer $212_1$ deposited or epitaxially grown directly on the base layer 210 and ending with a last conducting layer $214_4$. Thus, the sacrificial layers 214 are positioned to space the conducting layers 212 apart from each other. In one example, there are four conducting layers 212 and three sacrificial layers 214, although other numbers of layers are also possible.

The conducting layers 212 and the sacrificial layers 214 may be formed of different semiconductor materials. In one example, the conducting layers 212 comprise silicon that is doped in situ, while the sacrificial layers 214 comprise silicon germanium.

A source 216 is positioned at one end of the conducting channel region, while a drain 218 is positioned at the opposite end of the conducting channel region. Spacers $220_1$-$220_2$ (hereinafter collectively referred to as "spacers 220") are positioned between the conducting channel region and each of the source 216 and the drain 218.

The pFET region 204 comprises a substrate 208, formed, for example, from bulk silicon (Si) or silicon on insulator (SOI). In one example, the channel area of the pFET 204 region comprises a single base layer 222, formed, for example, from silicon germanium (SiGe) with a high germanium content deposited directly on the substrate 208. Deposited directly on the base layer 222 is a plurality of conducting layers $224_1$-$224_4$ (hereinafter collectively referred to as "conducting layers 224) and a plurality of sacrificial layers $226_1$-$226_3$ (hereinafter collectively referred to as "sacrificial layers 226"). The conducting layers 224 and the sacrificial layers 226 are arranged on the base layer 208 in an alternating manner, e.g., starting with a first conducting layer $224_1$ deposited directly on the base layer 208 and ending with a last conducting layer $224_4$. In one example, there are four conducting layers 224 and three sacrificial layers 226, although other numbers of layers are also possible.

The conducting layers 224 and the sacrificial layers 226 may be formed of different semiconductor materials. In one example, the conducting layers 224 comprise silicon germanium that has been doped in situ, while the sacrificial layers 226 comprise silicon.

A source 228 is positioned at one end of the conducting channel region, while a drain 230 is positioned at the opposite end of the conducting channel region. Spacers $232_1$-$232_2$ (hereinafter collectively referred to as "spacers 232") are positioned between the conducting channel region and each of the source 228 and the drain 230.

Referring to FIG. 2B, the sacrificial layers 214 of the nFET region 202 are next removed, e.g., by wet and/or dry/plasma etching. This leaves the plurality of conducting layers 212 suspended between the source 216 and the drain 218. As discussed above, the plurality of conducting layers 212 may comprise silicon that has been doped in situ.

Referring to FIG. 2C, the sacrificial layers 226 of the pFET region 204 are next removed, e.g., by wet and/or dry/plasma etching. This leaves the plurality of conducting layers 224 suspended between the source 228 and the drain 230. As discussed above, the plurality of conducting layers 224 may comprise silicon germanium that has been doped in situ.

Referring to FIG. 2D, the base layers 210 and 222 of the nFET region 202 and the pFET region 204, respectively, may be removed, e.g., by wet and/or dry/plasma etching.

Referring to FIG. 2E, a metal gate layers 234 and 236 may be deposited in the nFET region 202 and the pFET region 204, respectively, in a replacement metal gate (RMG) or gate-last process. As illustrated, the metal gate layers 234 and 236 fill in the spaces between the respective conducting layers 212 and 224 and surround the respective conducting layers 212 and 224. In one example, the metal gate layers 234 and 236 surround the respective conducting layers 212 and 224 on all sides, creating gate-all-around structures in both the nFET region 202 and the pFET region 204. The nFET region 202 has a second n-type threshold voltage (nVt2) that is higher than the first n-type threshold voltage nVt1 of the first FET 100 of FIGS. 1A-1E, while the pFET region 204 has a second p-type threshold voltage (pVt2) that is higher than the first p-type threshold voltage pVt1 of the first FET 100 of FIGS. 1A-1E.

A gate stack for a dual channel MOSFET (e.g., having a silicon channel in the nFET region and a silicon germanium channel in the pFET region) such as the FETs 100 and 200 illustrated in FIGS. 1A-1E and 2A-2E may be fabricated in one of a plurality of manners. In a first example, a single work function gate stack can be fabricated between a pFET and an nFET to achieve two nFET threshold voltages and two pFET threshold voltages.

In a second example, a single gate stack can be fabricated between a pFET and an nFET with metal doping to achieve four nFET threshold voltages (two with metal doping devices and two without metal doping devices) and four pFET threshold voltages (two with metal doping devices and two without metal doping devices).

In a third example, dual work function gate stacks can be fabricated between a pFET and an nFET to achieve four nFET threshold voltages and four pFET threshold voltages.

In a fourth example, dual work function gate stacks can be fabricated between a pFET and an nFET with metal doping to achieve eight nFET threshold voltages (four with metal doping devices and four without metal doping devices) and eight pFET threshold voltages (four with metal doping devices and four without metal doping devices).

FIG. 3A illustrates example gate stacks 300, 320, 330, and 340 that may be fabricated to achieve four n-type field effect transistor (nFET) threshold voltages without metal doping devices for a dual work function gate stack (e.g., as described in the fourth example above).

In one example, first and second nFET threshold voltages, nVt1 and nVt2 share the same gate stack to define the respective threshold voltages. However, the first nFET threshold voltage, nVt1, includes an additional metal doping layer to achieve a lower threshold voltage (relative to the second nFET threshold voltage nVt2).

In one example, gate stacks 300 and 320 for achieving the first nFET threshold voltage nVt1 and the second nFET threshold voltage nVt2, respectively, comprise a substrate 302, formed, for example, from undoped silicon (Si). In the case of the gate stack 300 for achieving the first nFET threshold voltage, a metal doping layer 310 is deposited directly on the substrate 302. In one example, the metal doping layer 310 is formed from a dipole in the gate stack 300 to change the threshold voltage. In one example, the metal doping layer 310 may comprise lanthanum, ytterbium, magnesium, and/or oxides of lanthanum, ytterbium, or magnesium.

An adjustment oxide layer 304 is next deposited. In the case of the gate stack 300 for achieving the first nFET threshold voltage nVt1, the adjustment oxide layer 304 is deposited directly on the metal doping layer 310; however, in the case of the gate stack 302 for achieving the second nFET threshold voltage nVt2, the adjustment oxide layer 304 is deposited directly on the substrate 302.

In both the gate stack 300 and the gate stack 320, the nFET threshold voltage could be defined by one layer of work function metal or by a multi-layer stack of work function metals. In one example, a three-layer metal gate stack is fabricated. In this case, a first layer 306 is deposited directly on the adjustment oxide layer 304. The first layer 306 may comprise a barrier layer metal, such as titanium nitride (TiN). The second layer 308 is deposited directly on the first layer 306. The second layer 308 may comprise an nFET work function metal, such as one or more of: aluminum (Al), titanium (Ti), titanium aluminum (TiAl), tantalum aluminum carbide (TaAlC), titanium carbide (TiC), titanium aluminum carbide (TiAlC). The third layer 312 is deposited directly on the second layer 308. The third layer 312 may comprise a barrier layer metal that may be the same as or different from the barrier layer metal used in the first layer 306.

In one example, third and fourth nFET threshold voltages, nVt3 and nVt4 share the same gate stack to define the respective threshold voltages. However, the third nFET threshold voltage, nVt3, includes an additional metal doping layer to achieve a lower threshold voltage (relative to the fourth nFET threshold voltage nVt4).

In one example, gate stacks 330 and 340, for achieving a third nFET threshold voltage (nVt3) and a fourth nFET threshold voltage (nVt4), respectively, comprise a substrate 302, formed, for example, from undoped silicon (Si). In the case of the gate stack 330 for achieving the third nFET threshold voltage, a metal doping layer 310 is deposited directly on the substrate 302. In one example, the metal doping layer 310 is formed from a dipole in the gate stack 330 to change the threshold voltage. In one example, the metal doping layer 310 may comprise lanthanum, ytterbium, magnesium, and/or oxides of lanthanum, ytterbium, or magnesium.

An adjustment oxide layer 304 is next deposited. In the case of the gate stack 330 for achieving the third nFET threshold voltage nVt3, the adjustment oxide layer 304 is deposited directly on the metal doping layer 310; however, in the case of the gate stack 340 for achieving the fourth nFET threshold voltage nVt4, the adjustment oxide layer 304 is deposited directly on the substrate 302.

In both the gate stack 330 and the gate stack 340, the nFET threshold voltage could be defined by one layer of work function metal or by a multi-layer stack of work function metals. In one example, a three-layer metal gate stack is fabricated. In this case, a first layer 306 is deposited directly on the adjustment oxide layer 304. The first layer 306 may comprise a barrier layer metal, such as titanium nitride (TiN). The second layer 308 is deposited directly on the first layer 306. The second layer 308 may comprise an nFET work function metal, such as one or more of: aluminum (Al), titanium (Ti), titanium aluminum (TiAl), tantalum aluminum carbide (TaAlC), titanium carbide (TiC), titanium aluminum carbide (TiAlC). The third layer 312 is deposited directly on the second layer 308. The third layer 312 may comprise a barrier layer metal that may be the same as or different from the barrier layer metal used in the first layer 306.

In one example, a second metal gate stack may be fabricated on top of each of the metal gate stacks just described. The second metal gate stack could comprise one layer of work function metal or a multi-layer stack of work function metals. In one example, the second metal gate stack comprises a three-layer stack that may or may not be identical (e.g., in layer compositions and/or layer thicknesses) to the first metal gate stack.

For instance a, fourth layer 314 may be deposited directly on the third layer 312. The fourth layer may comprise a barrier layer metal that may be the same as or different from the barrier layer metal used in the first layer 306 and/or third layer 312. Thus, when the barrier layer metal used in the fourth layer 314 is the same as the barrier layer metal used in the third layer 312, the third and fourth layers 312 and 314 effectively combine to form a single material layer having twice the thickness of the individual layers but with a thinner oxide layer between them due to either airbreak or patterning in the metal gate. The fifth layer 316 is deposited directly on the fourth layer 314. The fifth layer 316 may comprise a work function metal, such as one or more of: aluminum (Al), titanium (Ti), titanium aluminum (TiAl), tantalum aluminum carbide (TaAlC), titanium carbide (TiC), titanium aluminum carbide (TiAlC). The sixth layer 318 is deposited directly on the fifth layer 316. The sixth layer 318 may comprise a barrier layer metal that may be the same as or different from the barrier layer metal used in the first layer 306, third layer 312, or fourth layer 314.

FIG. 3B illustrates example gate stacks 350, 360, 370, and 380 that may be fabricated to achieve four p-type field effect transistor (pFET) threshold voltages without metal doping devices for a dual work function gate stack (e.g., as described in the fourth example above).

In one example, fourth and third pFET threshold voltages, pVt3 and pVt4 share the same gate stack to define the respective threshold voltages. However, the fourth pFET threshold voltage, pVt4, includes an additional metal doping layer to achieve a lower threshold voltage (relative to the third pFET threshold voltage pVt3).

In one example, gate stacks 350 and 360 for achieving the fourth pFET threshold voltage pVt4 and the third pFET threshold voltage pVt3, respectively, comprise a substrate 352, formed, for example, from undoped silicon germanium (SiGe). In the case of the gate stack 350 for achieving the fourth pFET threshold voltage, a metal doping layer 390 is deposited directly on the substrate 352. In one example, the metal doping layer 390 is formed from a dipole in the gate stack 350 to change the threshold voltage. In one example, the metal doping layer 390 may comprise lanthanum, ytterbium, magnesium, and/or oxides of lanthanum, ytterbium, or magnesium.

An adjustment oxide layer 354 is deposited. In the case of the gate stack 350 for achieving the fourth pFET threshold voltage pVt4, the adjustment oxide layer 354 is deposited directly on the metal doping layer 390; however, in the case of the gate stack 360 for achieving the third pFET threshold voltage pVt3, the adjustment oxide layer 354 is deposited directly on the substrate 352.

In both the gate stack 350 and the gate stack 360, the pFET threshold voltage could be defined by one layer of work function metal or by a multi-layer stack of work function metals. In one example, a three-layer metal gate stack is fabricated. In this case, a first layer 356 is deposited directly on the adjustment oxide layer 354. The first layer 356 may comprise a barrier layer metal, such as titanium nitride (TiN). The second layer 358 is deposited directly on the first layer 356. The second layer 358 may comprise a pFET work function metal, such as one or more of: aluminum (Al), titanium (Ti), titanium aluminum (TiAl), tantalum aluminum carbide (TaAlC), titanium carbide (TiC), titanium aluminum carbide (TiAlC). The third layer 392 is deposited directly on the second layer 358. The third layer 392 may comprise a barrier layer metal that may be the same as or different from the barrier layer metal used in the first layer 356.

In one example, second and first pFET threshold voltages, pVt2 and pVt1 share the same gate stack to define the respective threshold voltages. However, the second pFET threshold voltage, pVt2, includes an additional metal doping layer to achieve a lower threshold voltage (relative to the first pFET threshold voltage pVt1).

In one example, gate stacks 370 and 380, for achieving the second pFET threshold voltage pVt2 and the first pFET threshold voltage pVt1, respectively, comprise a substrate 352, formed, for example, from undoped silicon germanium (SiGe). In the case of the gate stack 370 for achieving the second pFET threshold voltage, a metal doping layer 390 is deposited directly on the substrate 352. In one example, the metal doping layer 390 is formed from a dipole in the gate stack 370 to change the threshold voltage. In one example, the metal doping layer 390 may comprise lanthanum, ytterbium, magnesium, and/or oxides of lanthanum, ytterbium, or magnesium.

An adjustment oxide layer 354 is next deposited. In the case of the gate stack 370 for achieving the second pFET threshold voltage pVt2, the adjustment oxide layer 354 is deposited directly on the metal doping layer 390; however, in the case of the gate stack 380 for achieving the first pFET threshold voltage pVt1, the adjustment oxide layer 354 is deposited directly on the substrate 352.

In both the gate stack 370 and the gate stack 380, the pFET threshold voltage could be defined by one layer of work function metal or by a multi-layer stack of work function metals. In one example, a three-layer metal gate stack is fabricated. In this case, a first layer 356 is deposited directly on the adjustment oxide layer 354. The first layer 356 may comprise a barrier layer metal, such as titanium nitride (TiN). The second layer 358 is deposited directly on the first layer 356. The second layer 358 may comprise a pFET work function metal, such as one or more of: aluminum (Al), titanium (Ti), titanium aluminum (TiAl), tantalum aluminum carbide (TaAlC), titanium carbide (TiC), titanium aluminum carbide (TiAlC). The third layer 392 is deposited directly on the second layer 358. The third layer 392 may comprise a barrier layer metal that may be the same as or different from the barrier layer metal used in the first layer 356.

In one example, a second metal gate stack may be fabricated on top of each of the metal gate stacks just described. The second metal gate stack could comprise one layer of work function metal or a multi-layer stack of work function metals. In one example, the second metal gate stack comprises a three-layer stack that may or may not be identical (e.g., in layer compositions and/or layer thicknesses) to the first metal gate stack.

For instance a, fourth layer 394 may be deposited directly on the third layer 392. The fourth layer 394 may comprise a barrier layer metal that may be the same as or different from the barrier layer metal used in the first layer 356 and/or third layer 392. Thus, when the barrier layer metal used in the fourth layer 394 is the same as the barrier layer metal used in the third layer 352, the third and fourth layers 392 and 394 effectively combine to form a single material layer having twice the thickness of the individual layers but with a thinner oxide layer between them due to either airbreak or patterning in the metal gate. The fifth layer 396 is deposited directly on the fourth layer 394. The fifth layer 396 may comprise a pFET work function metal, such as one or more of: aluminum (Al), titanium (Ti), titanium aluminum (TiAl), tantalum aluminum carbide (TaAlC), titanium carbide (TiC), titanium aluminum carbide (TiAlC). The sixth layer 398 is deposited directly on the fifth layer 396. The sixth layer 398 may comprise a barrier layer metal that may be the same as or different from the barrier layer metal used in the first layer 356, third layer 392, or fourth layer 394.

FIG. 3C illustrates example gate stacks 301, 321, 331, and 341 that may be fabricated to achieve four n-type field effect transistor (nFET) threshold voltages with metal doping devices for a dual work function gate stack (e.g., as described in the fourth example above).

In one example, fifth and sixth nFET threshold voltages, nVt5 and nVt6 share the same gate stack to define the respective threshold voltages. However, the fifth nFET threshold voltage, nVt5, includes an additional metal doping layer to achieve a lower threshold voltage (relative to the sixth nFET threshold voltage nVt6).

In one example, gate stacks 301 and 321 for achieving the fifth nFET threshold voltage nVt5 and the sixth nFET threshold voltage nVt6, respectively, comprise a substrate 303, formed, for example, from silicon (Si) doped in situ to induce a shift in the threshold voltage (i.e., relative to a gate stack formed on an undoped substrate, such as the gate stack 300 of FIG. 3A, for instance). In the case of the gate stack 301 for achieving the fifth nFET threshold voltage, a metal doping layer 305 is deposited directly on the substrate 303. In one example, the metal doping layer 305 is formed from a dipole in the gate stack 301 to change the threshold voltage. In one example, the metal doping layer 305 may comprise lanthanum, ytterbium, magnesium, and/or oxides of lanthanum, ytterbium, or magnesium.

An adjustment oxide layer 307 is next deposited. In the case of the gate stack 301 for achieving the fifth nFET threshold voltage nVt5, the adjustment oxide layer 307 is deposited directly on the metal doping layer 305; however, in the case of the gate stack 321 for achieving the sixth nFET threshold voltage nVt6, the adjustment oxide layer 307 is deposited directly on the substrate 303.

In both the gate stack 301 and the gate stack 321, the nFET threshold voltage could be defined by one layer of work function metal or by a multi-layer stack of work function metals. In one example, a three-layer metal gate stack is fabricated. In this case, a first layer 309 is deposited directly on the adjustment oxide layer 307. The first layer 309 may comprise a barrier layer metal, such as titanium nitride (TiN). The second layer 311 is deposited directly on the first layer 309. The second layer 311 may comprise an nFET work function metal, such as one or more of: aluminum (Al), titanium (Ti), titanium aluminum (TiAl), tantalum aluminum carbide (TaAlC), titanium carbide (TiC), titanium aluminum carbide (TiAlC). The third layer 313 is deposited directly on the second layer 311. The third layer 313 may comprise a barrier layer metal that may be the same as or different from the barrier layer metal used in the first layer 309.

In one example, seventh and eighth nFET threshold voltages, nVt7 and nVt8 share the same gate stack to define the respective threshold voltages. However, the seventh nFET threshold voltage, nVt7, includes an additional metal doping layer to achieve a lower threshold voltage (relative to the eighth nFET threshold voltage nVt8).

In one example, gate stacks 331 and 341 for achieving the seventh nFET threshold voltage nVt7 and the eighth nFET threshold voltage nVt8, respectively, comprise a substrate 303, formed, for example, from silicon (Si) doped in situ to induce a shift in the threshold voltage (i.e., relative to a gate stack formed on an undoped substrate, such as the gate stack 330 of FIG. 3A, for instance). In the case of the gate stack 331 for achieving the seventh nFET threshold voltage, a metal doping layer 305 is deposited directly on the substrate 303. In one example, the metal doping layer 305 is formed from a dipole in the gate stack 331 to change the threshold voltage. In one example, the metal doping layer 305 may comprise lanthanum, ytterbium, magnesium, and/or oxides of lanthanum, ytterbium, or magnesium.

An adjustment oxide layer 3307 is next deposited. directly on the substrate 362. In the case of the gate stack 331 for achieving the seventh nFET threshold voltage nVt7, the adjustment oxide layer 307 is deposited directly on the metal doping layer 305; however, in the case of the gate stack 341 for achieving the eighth nFET threshold voltage nVt8, the adjustment oxide layer 307 is deposited directly on the substrate 303.

In both the gate stack 331 and the gate stack 341, the nFET threshold voltage could be defined by one layer of work function metal or by a multi-layer stack of work function metals. In one example, a three-layer metal gate stack is fabricated. In this case, a first layer 309 is deposited directly on the adjustment oxide layer 307. The first layer 309 may comprise a barrier layer metal, such as titanium nitride (TiN). The second layer 311 is deposited directly on the first layer 309. The second layer 311 may comprise an nFET work function metal, such as one or more of: aluminum (Al), titanium (Ti), titanium aluminum (TiAl), tantalum aluminum carbide (TaAlC), titanium carbide (TiC), titanium aluminum carbide (TiAlC). The third layer 313 is deposited directly on the second layer 311. The third layer 313 may comprise a barrier layer metal that may be the same as or different from the barrier layer metal used in the first layer 309.

In one example, a second metal gate stack may be fabricated on top of each of the metal gate stacks just described. The second metal gate stack could comprise one layer of work function metal or a multi-layer stack of work function metals. In one example, the second metal gate stack comprises a three-layer stack that may or may not be identical (e.g., in layer compositions and/or layer thicknesses) to the first metal gate stack.

For instance a, fourth layer 315 may be deposited directly on the third layer 313. The fourth layer 315 may comprise a barrier layer metal that may be the same as or different from the barrier layer metal used in the first layer 309 and/or third layer 313. Thus, when the barrier layer metal used in the fourth layer 315 is the same as the barrier layer metal used in the third layer 313, the third and fourth layers 313 and 315 effectively combine to form a single material layer having twice the thickness of the individual layers but with a thinner oxide layer between them due to either airbreak or patterning in the metal gate. The fifth layer 317 is deposited directly on the fourth layer 315. The fifth layer 317 may comprise an nFET work function metal, such as one or more of: aluminum (Al), titanium (Ti), titanium aluminum (TiAl), tantalum aluminum carbide (TaAlC), titanium carbide (TiC), titanium aluminum carbide (TiAlC). The sixth layer 319 is deposited directly on the fourth layer 317. The sixth layer 319 may comprise a barrier layer metal that may be the same as or different from the barrier layer metal used in the first layer 309, third layer 313, or fourth layer 315.

Figure 3D:
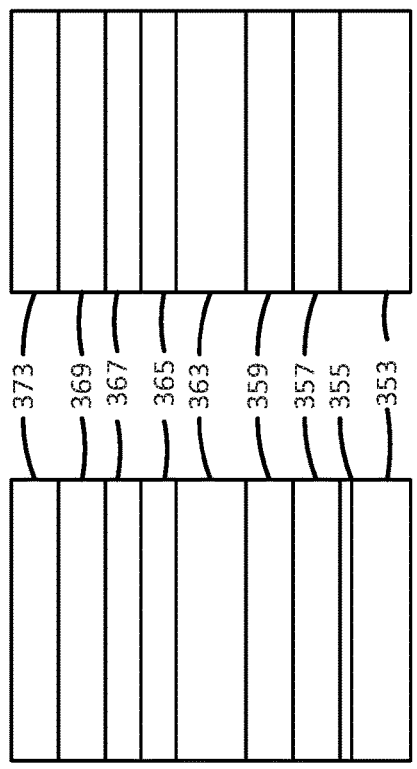
FIG. 3D illustrates example gate stacks that may be fabricated to achieve four p-type field effect transistor (pFET) threshold voltages with metal doping devices for a dual work function gate stack.

FIG. 3D illustrates example gate stacks 351, 361, 371, and 381 that may be fabricated to achieve four p-type field effect transistor (pFET) threshold voltages with metal doping devices for a dual work function gate stack (e.g., as described in the fourth example above).

In one example, eighth and seventh pFET threshold voltages, pVt8 and pVt7, share the same gate stack to define the respective threshold voltages. However, the eighth pFET threshold voltage, pVt8, includes an additional metal doping layer to achieve a lower threshold voltage (relative to the seventh pFET threshold voltage pVt7).

In one example, gate stacks 351 and 361 for achieving the eighth pFET threshold voltage pVt8 and the seventh pFET threshold voltage pVt7, respectively, comprise a substrate 353, formed, for example, from silicon germanium (SiGe) doped in situ to induce a shift in the threshold voltage (i.e., relative to a gate stack formed on an undoped substrate, such as the gate stack 300 of FIG. 3B, for instance). In the case of the gate stack 351 for achieving the eighth pFET threshold voltage, a metal doping layer 355 is deposited directly on the substrate 353. In one example, the metal doping layer 355 is formed from a dipole in the gate stack 351 to change the threshold voltage. In one example, the metal doping layer 355 may comprise lanthanum, ytterbium, magnesium, and/or oxides of lanthanum, ytterbium, or magnesium.

An adjustment oxide layer 357 is next deposited. In the case of the gate stack 351 for achieving the eighth pFET threshold voltage pVt8, the adjustment oxide layer 357 is deposited directly on the metal doping layer 355; however, in the case of the gate stack 361 for achieving the seventh pFET threshold voltage pVt7, the adjustment oxide layer 357 is deposited directly on the substrate 353.

In both the gate stack 351 and the gate stack 361, the pFET threshold voltage could be defined by one layer of work function metal or by a multi-layer stack of work function metals. In one example, a three-layer metal gate stack is fabricated. In this case, a first layer 359 is deposited directly on the adjustment oxide layer 357. The first layer 359 may comprise a barrier layer metal, such as titanium nitride (TiN). The second layer 363 is deposited directly on the first layer 359. The second layer 363 may comprise a pFET work function metal, such as one or more of: aluminum (Al), titanium (Ti), titanium aluminum (TiAl), tantalum aluminum carbide (TaAlC), titanium carbide (TiC), titanium aluminum carbide (TiAlC). The third layer 365 is deposited directly on the second layer 363. The third layer 365 may comprise a barrier layer metal that may be the same as or different from the barrier layer metal used in the first layer 359.

In one example, sixth and fifth pFET threshold voltages, pVt6 and pVt5, share the same gate stack to define the respective threshold voltages. However, the sixth pFET threshold voltage, pVt6, includes an additional metal doping layer to achieve a lower threshold voltage (relative to the fifth pFET threshold voltage pVt5).

In one example, gate stack 371 and 381 for achieving the sixth pFET threshold voltage pVt6 and the fifth pFET threshold voltage pVt5, respectively, comprise a substrate 353, formed, for example, from silicon germanium (SiGe) doped in situ to induce a shift in the threshold voltage (i.e., relative to a gate stack formed on an undoped substrate, such as the gate stack 370 of FIG. 3B, for instance). In the case of the gate stack 371 for achieving the sixth pFET threshold voltage, a metal doping layer 355 is deposited directly on the substrate 353. In one example, the metal doping layer 355 is formed from a dipole in the gate stack 351 to change the threshold voltage. In one example, the metal doping layer 355 may comprise lanthanum, ytterbium, magnesium, and/or oxides of lanthanum, ytterbium, or magnesium.

An adjustment oxide layer 357 is next deposited. In the case of the gate stack 361 for achieving the sixth pFET threshold voltage pVt6, the adjustment oxide layer 357 is deposited directly on the metal doping layer 355; however, in the case of the gate stack 371 for achieving the fifth pFET threshold voltage pVt5, the adjustment oxide layer 357 is deposited directly on the substrate 353.

In both the gate stack 371 and the gate stack 381, the pFET threshold voltage could be defined by one layer of work function metal or by a multi-layer stack of work function metals. In one example, a three-layer metal gate stack is fabricated. In this case, a first layer 359 is deposited directly on the adjustment oxide layer 357. The first layer 359 may comprise a barrier layer metal, such as titanium nitride (TiN). The second layer 363 is deposited directly on the first layer 359. The second layer 363 may comprise a pFET work function metal, such as one or more of: aluminum (Al), titanium (Ti), titanium aluminum (TiAl), tantalum aluminum carbide (TaAlC), titanium carbide (TiC), titanium aluminum carbide (TiAlC). The third layer 365 is deposited directly on the second layer 363. The third layer 365 may comprise a barrier layer metal that may be the same as or different from the barrier layer metal used in the first layer 359.

In one example, a second metal gate stack may be fabricated on top of each of the metal gate stacks just described. The second metal gate stack could comprise one layer of work function metal or a multi-layer stack of work function metals. In one example, the second metal gate stack comprises a three-layer stack that may or may not be identical (e.g., in layer compositions and/or layer thicknesses) to the first metal gate stack.

For instance a, fourth layer 367 may be deposited directly on the third layer 365. The fourth layer 367 may comprise a barrier layer metal that may be the same as or different from the barrier layer metal used in the first layer 359 and/or third layer 365. Thus, when the barrier layer metal used in the fourth layer 367 is the same as the barrier layer metal used in the third layer 365, the third and fourth layers 365 and 367 effectively combine to form a single material layer having twice the thickness of the individual layers but with a thinner oxide layer between them due to either airbreak or patterning in the metal gate. The fifth layer 369 is deposited directly on the fourth layer 367. The fifth layer 369 may comprise a pFET work function metal, such as one or more of: aluminum (Al), titanium (Ti), titanium aluminum (TiAl), tantalum aluminum carbide (TaAlC), titanium carbide (TiC), titanium aluminum carbide (TiAlC). The sixth layer 373 is deposited directly on the fourth layer 369. The sixth layer 373 may comprise a barrier layer metal that may be the same as or different from the barrier layer metal used in the first layer 359, third layer 365, or fourth layer 367.

FIGS. 4A-4E illustrate cross sectional views of a third field effect transistor 400 during various stages of a fabrication process performed according to examples of the present disclosure. As such, when viewed in sequence, FIGS. 4A-4E also serve as a flow diagram for the fabrication process. In particular, FIGS. 4A-4E illustrate a process by which a dual-channel GAA FET may be fabricated using undoped conducting channels.

Figure 4A:
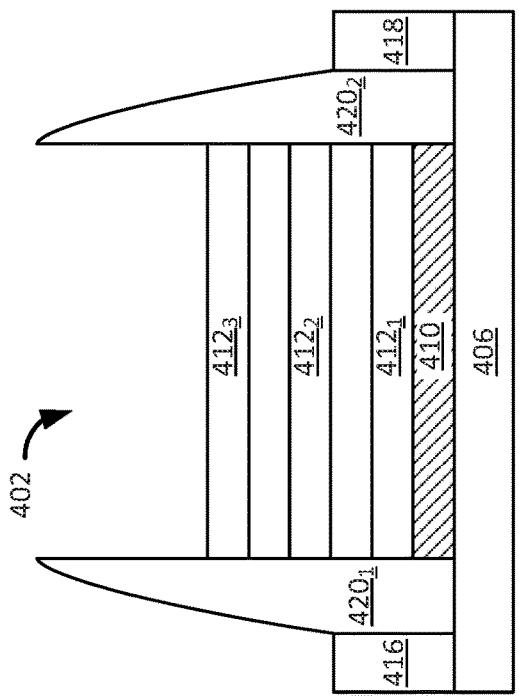

Referring to FIG. 4A, the first FET 400 comprises an nFET region 402 and a pFET region 404. The nFET region 402 comprises a substrate 406, formed, for example, from bulk silicon (Si) or silicon on insulator (SOI). In one example, the channel area of the nFET 402 region comprises a single base layer 410, formed, for example, from silicon germanium (SiGe) with a high germanium content deposited directly on the substrate 406. Deposited or epitaxially grown directly on the base layer 410 is a plurality of conducting layers $412_1$-$412_3$ (hereinafter collectively referred to as "conducting layers 412) and a plurality of sacrificial layers $414_1$-$414_3$ (hereinafter collectively referred to as "sacrificial layers 414"). The conducting layers 412 and the sacrificial layers 414 are arranged on the base layer 410 in an alternating manner, e.g., starting with a first conducting layer $412_1$ deposited or epitaxially grown directly on the base layer 410 and ending with a last sacrificial layer $414_3$. Thus, the sacrificial layers 414 are positioned to space the conducting layers 412 apart from each other. In one example, there are three conducting layers 412 and three sacrificial layers 414, although other numbers of layers are also possible.

The conducting layers 412 and the sacrificial layers 414 may be formed of different semiconductor materials. In one example, the conducting layers 412 comprise undoped silicon, while the sacrificial layers 414 comprise undoped silicon germanium.

A source 416 is positioned at one end of the conducting channel region, while a drain 418 is positioned at the opposite end of the conducting channel region. Spacers $420_1$-$420_2$ (hereinafter collectively referred to as "spacers 420") are positioned between the conducting channel region and each of the source 416 and the drain 418.

The pFET region 404 comprises a substrate 408, formed, for example, from bulk silicon (Si) or silicon on insulator (SOI). In one example, the channel area of the pFET 404 region comprises a single base layer 422, formed, for example, from silicon germanium (SiGe) with a high germanium content deposited directly on the substrate 408. Deposited directly on the base layer 422 is a plurality of conducting layers $424_1$-$424_3$ (hereinafter collectively referred to as "conducting layers 424) and a plurality of sacrificial layers $426_1$-$426_3$ (hereinafter collectively referred to as "sacrificial layers 426"). The conducting layers 424 and the sacrificial layers 426 are arranged on the base layer 408 in an alternating manner, e.g., starting with a first conducting layer $424_1$ deposited directly on the base layer 408 and ending with a last sacrificial layer $424_3$. In one example, there are three conducting layers 424 and three sacrificial layers 426, although other numbers of layers are also possible.

The conducting layers 424 and the sacrificial layers 426 may be formed of different semiconductor materials. In one example, the conducting layers 424 comprise undoped silicon germanium, while the sacrificial layers 426 comprise undoped silicon.

A source 428 is positioned at one end of the conducting channel region, while a drain 430 is positioned at the opposite end of the conducting channel region. Spacers $432_1$-$432_2$ (hereinafter collectively referred to as "spacers 432") are positioned between the conducting channel region and each of the source 428 and the drain 430.

Figure 4B:
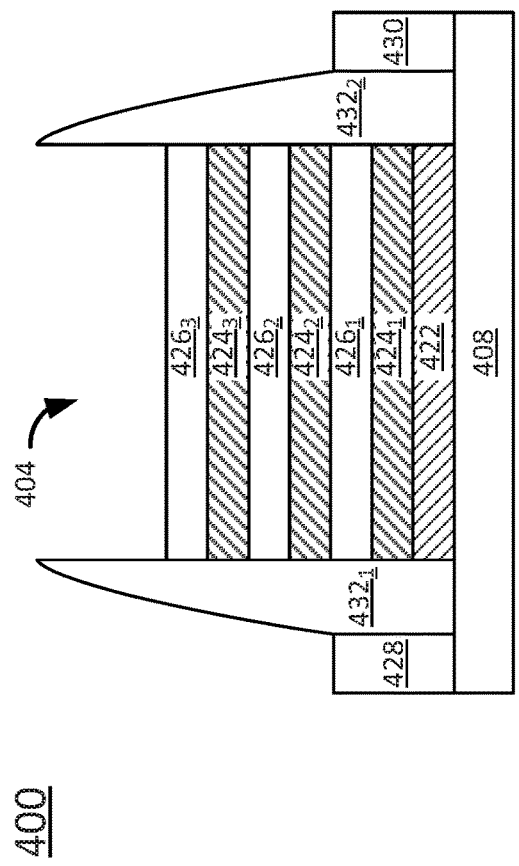

Referring to FIG. 4B, the sacrificial layers 414 of the nFET region 402 are next removed, e.g., by wet and/or dry/plasma etching. This leaves the plurality of conducting layers 412 suspended between the source 416 and the drain 418. As discussed above, the plurality of conducting layers 412 may comprise undoped silicon.

Figure 4C:
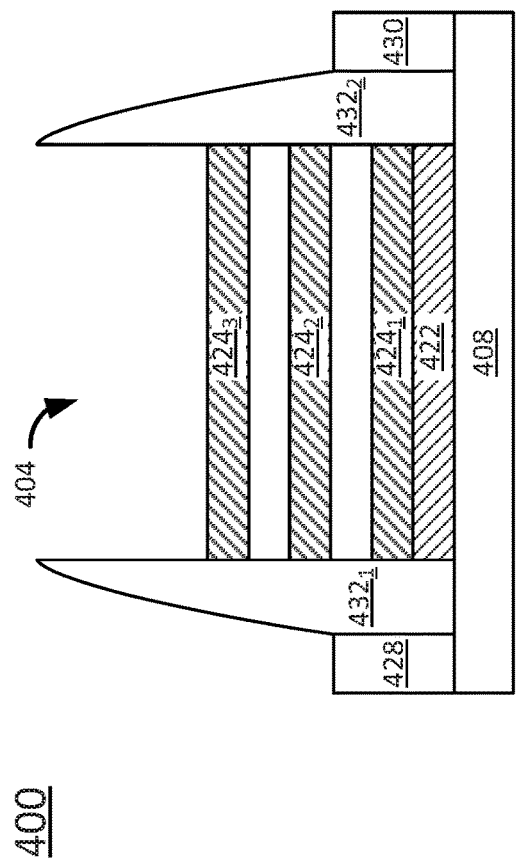
Figure 4C:
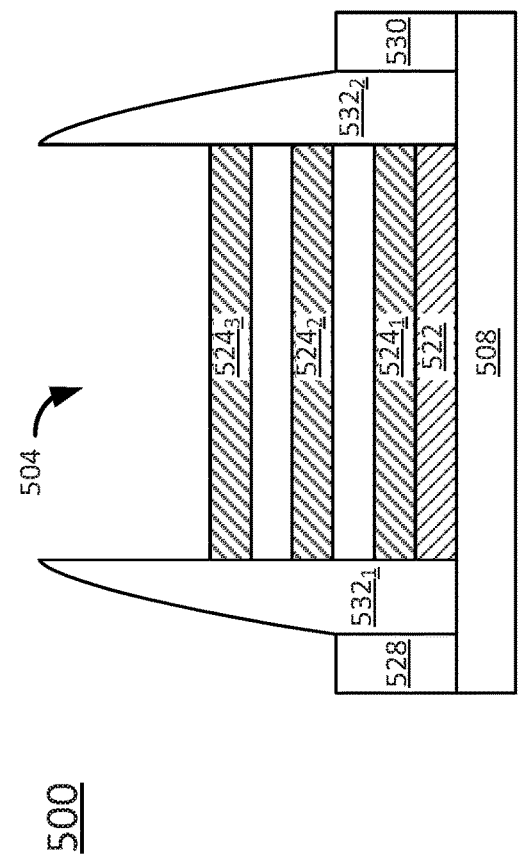

Referring to FIG. 4C, the sacrificial layers 426 of the pFET region 404 are next removed, e.g., by wet and/or dry/plasma etching. This leaves the plurality of conducting layers 424 suspended between the source 428 and the drain 430. As discussed above, the plurality of conducting layers 424 may comprise undoped silicon germanium.

Referring to FIG. 4D, the base layers 410 and 422 of the nFET region 402 and the pFET region 404, respectively, may be removed, e.g., by wet and/or dry/plasma etching.

Referring to FIG. 4E, a metal gate layers 434 and 436 may be deposited in the nFET region 402 and the pFET region 404, respectively, in a replacement metal gate (RMG) or gate-last process. As illustrated, the metal gate layers 434 and 436 fill in the spaces between the respective conducting layers 412 and 424 and surround the respective conducting layers 412 and 424. In one example, the metal gate layers 434 and 436 surround the respective conducting layers 412 and 424 on all sides, creating gate-all-around structures in both the nFET region 402 and the pFET region 404. The nFET region 402 has a first n-type threshold voltage (nVt1), while the pFET region 404 has a first p-type threshold voltage (pVt1).

FIGS. 5A-5E illustrate cross sectional views of a fourth field effect transistor 500 during various stages of a fabrication process performed according to examples of the present disclosure. As such, when viewed in sequence, FIGS. 5A-5E also serve as a flow diagram for the fabrication process. In particular, FIGS. 5A-5E illustrate a process by which a dual-channel GAA FET may be fabricated using in situ doping of the conducting channels. The fourth FET 500 illustrated in FIGS. 5A-5E has a higher threshold voltage, both in the nFET region and the pFET region, than the third FET 400 illustrated in FIGS. 4A-4E. Furthermore, in the example illustrated in FIGS. 5A-5E, unlike the example illustrated in FIGS. 2A-2E, some degree of counter doping between the conducting layers and sacrificial layers may occur.

Figure 5A:
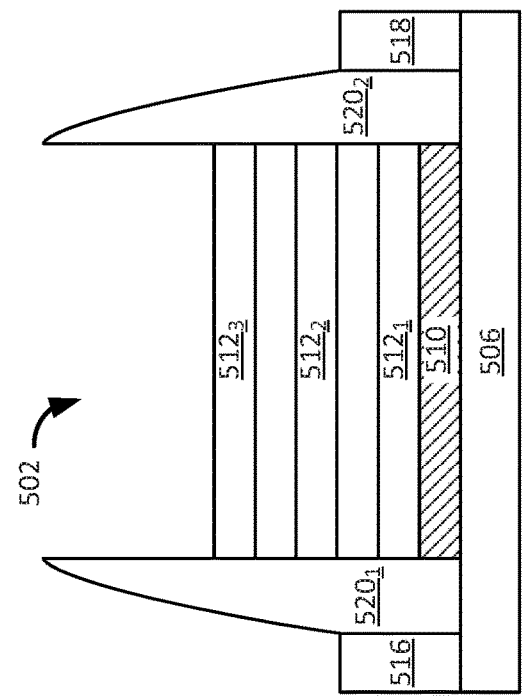

Referring to FIG. 5A, the fourth FET 500 comprises an nFET region 502 and a pFET region 504. The nFET region 502 comprises a substrate 506, formed, for example, from bulk silicon (Si) or silicon on insulator (SOI). In one example, the channel area of the nFET 502 region comprises a single base layer 510, formed, for example, from silicon germanium (SiGe) with a high germanium content deposited directly on the substrate 506. Deposited or epitaxially grown directly on the base layer 510 is a plurality of conducting layers $512_1$-$512_3$ (hereinafter collectively referred to as "conducting layers 512) and a plurality of sacrificial layers $514_1$-$514_3$ (hereinafter collectively referred to as "sacrificial layers 514"). The conducting layers 512 and the sacrificial layers 514 are arranged on the base layer 510 in an alternating manner, e.g., starting with a first conducting layer $512_1$ deposited or epitaxially grown directly on the base layer 510 and ending with a last sacrificial layer $514_3$. Thus, the sacrificial layers 514 are positioned to space the conducting layers 512 apart from each other. In one example, there are three conducting layers 512 and three sacrificial layers 514, although other numbers of layers are also possible.

The conducting layers 512 and the sacrificial layers 514 may be formed of different semiconductor materials. In one example, the conducting layers 512 comprise silicon that is n-doped in situ, while the sacrificial layers 514 comprise silicon germanium that is p-doped in situ.

A source 516 is positioned at one end of the conducting channel region, while a drain 518 is positioned at the opposite end of the conducting channel region. Spacers $520_1$-$520_2$ (hereinafter collectively referred to as "spacers 520") are positioned between the conducting channel region and each of the source 516 and the drain 518.

The pFET region 504 comprises a substrate 508, formed, for example, from bulk silicon (Si) or silicon on insulator (SOI). In one example, the channel area of the pFET 504 region comprises a single base layer 522, formed, for example, from silicon germanium (SiGe) with a high germanium content deposited directly on the substrate 508. Deposited directly on the base layer 522 is a plurality of conducting layers $524_1$-$524_3$ (hereinafter collectively referred to as "conducting layers 524) and a plurality of sacrificial layers $526_1$-$526_3$ (hereinafter collectively referred to as "sacrificial layers 526"). The conducting layers 524 and the sacrificial layers 526 are arranged on the base layer 508 in an alternating manner, e.g., starting with a first conducting layer $524_1$ deposited directly on the base layer 508 and ending with a last sacrificial layer $526_3$. In one example, there are three conducting layers 524 and three sacrificial layers 526, although other numbers of layers are also possible.

The conducting layers 524 and the sacrificial layers 526 may be formed of different semiconductor materials. In one example, the conducting layers 524 comprise silicon germanium that has been p-doped in situ, while the sacrificial layers 526 comprise silicon that has been n-doped in situ.

A source 528 is positioned at one end of the conducting channel region, while a drain 530 is positioned at the opposite end of the conducting channel region. Spacers $532_1$-$532_2$ (hereinafter collectively referred to as "spacers 532") are positioned between the conducting channel region and each of the source 528 and the drain 530.

Figure 5B:
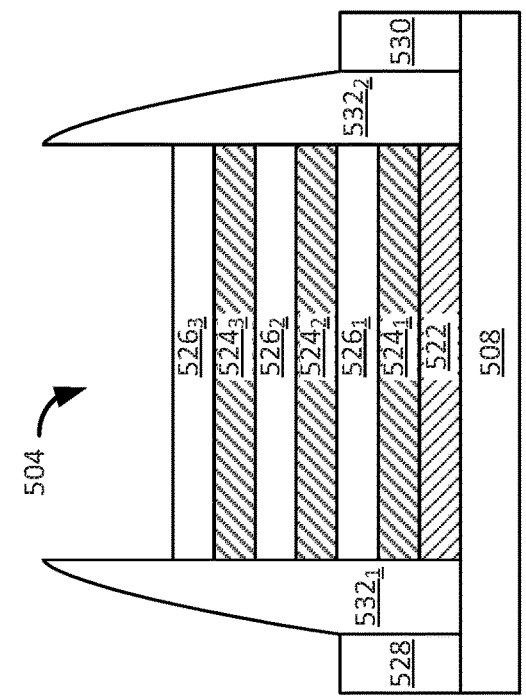

Referring to FIG. 5B, the sacrificial layers 514 of the nFET region 502 are next removed, e.g., by wet and/or dry/plasma etching. This leaves the plurality of conducting layers 512 suspended between the source 516 and the drain 518. As discussed above, the plurality of conducting layers 512 may comprise silicon that has been doped in situ.

Figure 5C:
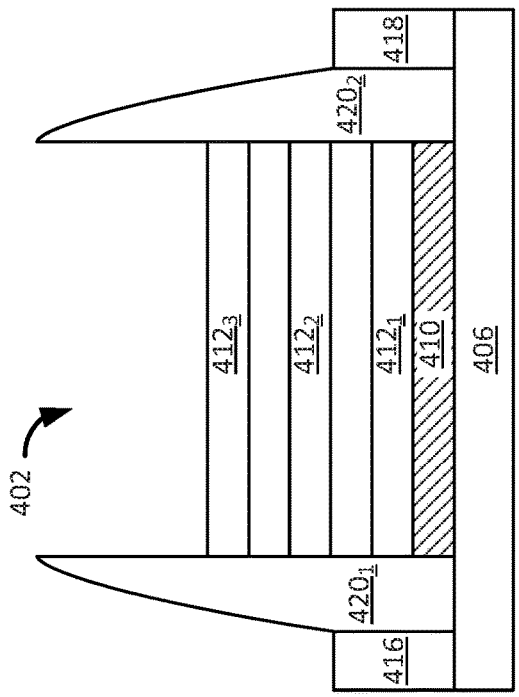
Figure 5C:
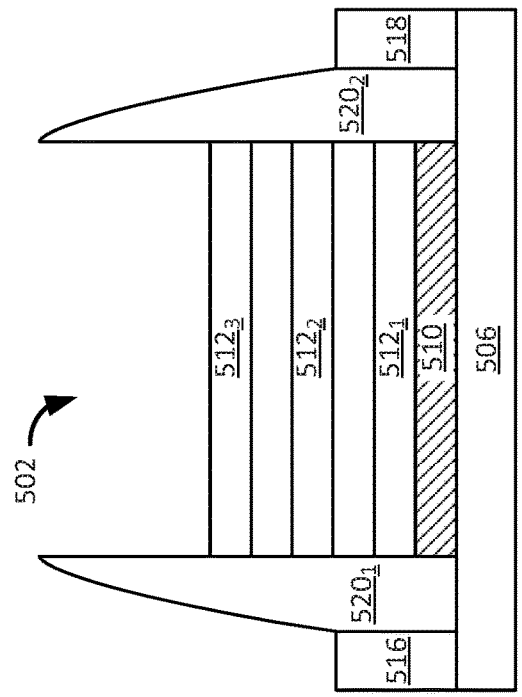

Referring to FIG. 5C, the sacrificial layers 526 of the pFET region 504 are next removed, e.g., by wet and/or dry/plasma etching. This leaves the plurality of conducting layers 524 suspended between the source 528 and the drain 530. As discussed above, the plurality of conducting layers 524 may comprise silicon germanium that has been doped in situ.

Referring to FIG. 5D, the base layers 510 and 522 of the nFET region 502 and the pFET region 504, respectively, may be removed, e.g., by wet and/or dry/plasma etching.

Referring to FIG. 5E, a metal gate layers 534 and 536 may be deposited in the nFET region 502 and the pFET region 504, respectively, in a replacement metal gate (RMG) or gate-last process. As illustrated, the metal gate layers 534 and 536 fill in the spaces between the respective conducting layers 512 and 524 and surround the respective conducting layers 512 and 524. In one example, the metal gate layers 534 and 536 surround the respective conducting layers 512 and 524 on all sides, creating gate-all-around structures in both the nFET region 502 and the pFET region 504. The nFET region 502 has a second n-type threshold voltage (nVt2) that is higher than the first n-type threshold voltage nVt1 of the third FET 400 of FIGS. 4A-4E, while the pFET region 504 has a second p-type threshold voltage (pVt2) that is higher than the first p-type threshold voltage pVt1 of the third FET 400 of FIGS. 4A-4E.

FIGS. 6A-6D illustrate cross sectional views of a fifth field effect transistor 600 during various stages of a fabrication process performed according to examples of the present disclosure. As such, when viewed in sequence, FIGS. 6A-6E also serve as a flow diagram for the fabrication process. In particular, FIGS. 6A-6E illustrate a process by which a dual-channel GAA FET may be fabricated using undoped conducting channels. Furthermore, in the example illustrated in FIGS. 6A-6E, little or no counter doping is likely to occur between the conducting layers and sacrificial layers.

Referring to FIG. 6A, the first FET 600 comprises an nFET region 602. The nFET region 602 comprises a substrate 606, formed, for example, from bulk silicon (Si) or silicon on insulator (SOI). In one example, the channel area of the nFET 602 region comprises a single base layer 610, formed, for example, from silicon germanium (SiGe) with a high germanium content deposited directly on the substrate 606. Deposited or epitaxially grown directly on the base layer 610 is a plurality of conducting layers $612i$-$612_4$ (hereinafter collectively referred to as "conducting layers 612) and a plurality of sacrificial layers $614_1$-$614_3$ (hereinafter collectively referred to as "sacrificial layers 614"). The conducting layers 612 and the sacrificial layers 614 are arranged on the base layer 610 in an alternating manner, e.g., starting with a first conducting layer $612_1$ deposited or epitaxially grown directly on the base layer 610 and ending with a last conducting layer $614_4$. Thus, the sacrificial layers 614 are positioned to space the conducting layers 612 apart from each other. In one example, there are four conducting layers 612 and three sacrificial layers 614, although other numbers of layers are also possible.

The conducting layers 612 and the sacrificial layers 614 may be formed of different semiconductor materials. In one example, the conducting layers 612 comprise undoped silicon, while the sacrificial layers 614 comprise silicon germanium.

A source 616 is positioned at one end of the conducting channel region, while a drain 618 is positioned at the opposite end of the conducting channel region. Spacers $620_1$-$620_2$ (hereinafter collectively referred to as "spacers 620") are positioned between the conducting channel region and each of the source 616 and the drain 618.

Referring to FIG. 6B, the sacrificial layers 614 of the nFET region 602 are next removed, e.g., by wet and/or dry/plasma etching. This leaves the plurality of conducting layers 612 suspended between the source 616 and the drain 618. As discussed above, the plurality of conducting layers 612 may comprise undoped silicon.

Referring to FIG. 6C, the base layer 610 of the nFET region 602 may be removed, e.g., by wet and/or dry/plasma etching.

Referring to FIG. 6D, a metal gate layer 634 may be deposited in the nFET region 602, in a replacement metal gate (RMG) or gate-last process. As illustrated, the metal gate layer 634 fills in the spaces between the conducting layers 612 and surrounds the conducting layers 612. In one example, the metal gate layer 634 surrounds the conducting layers 612 on all sides, creating a gate-all-around structure in the nFET region 602. The nFET region 602 has a first n-type threshold voltage (nVt1).

FIGS. 7A-7D illustrate cross sectional views of a sixth field effect transistor 700 during various stages of a fabrication process performed according to examples of the present disclosure. As such, when viewed in sequence, FIGS. 7A-7E also serve as a flow diagram for the fabrication process. In particular, FIGS. 7A-7E illustrate a process by which a dual-channel GAA FET may be fabricated using in situ doping of the conducting channels. The sixth FET 700 illustrated in FIGS. 7A-7E has a higher nFET threshold voltages and pFET threshold voltages than the fifth FET 600 illustrated in FIGS. 6A-6D. Furthermore, in the example illustrated in FIGS. 7A-7E, little or no counter doping is likely to occur between the conducting layers and sacrificial layers.

Referring to FIG. 7A, the sixth FET 700 comprises an nFET region 702 and a pFET region 704. The nFET region 702 comprises a substrate 706, formed, for example, from bulk silicon (Si) or silicon on insulator (SOI). In one example, the channel area of the nFET 702 region comprises a single base layer 710, formed, for example, from silicon germanium (SiGe) with a high germanium content deposited directly on the substrate 706. Deposited or epitaxially grown directly on the base layer 710 is a plurality of conducting layers $712_1$-$712_4$ (hereinafter collectively referred to as "conducting layers 712) and a plurality of sacrificial layers $714_1$-$714_3$ (hereinafter collectively referred to as "sacrificial layers 714"). The conducting layers 712 and the sacrificial layers 714 are arranged on the base layer 710 in an alternating manner, e.g., starting with a first conducting layer $712_1$ deposited or epitaxially grown directly on the base layer 710 and ending with a last conducting layer $714_4$. Thus, the sacrificial layers 714 are positioned to space the conducting layers 712 apart from each other. In one example, there are four conducting layers 712 and three sacrificial layers 714, although other numbers of layers are also possible.

The conducting layers 712 and the sacrificial layers 714 may be formed of different semiconductor materials. In one example, the conducting layers 712 comprise silicon that is n-doped in situ, while the sacrificial layers 714 comprise silicon germanium.

A source 716 is positioned at one end of the conducting channel region, while a drain 718 is positioned at the opposite end of the conducting channel region. Spacers $720_1$-$720_2$ (hereinafter collectively referred to as "spacers 720") are positioned between the conducting channel region and each of the source 716 and the drain 718.

The pFET region 704 comprises a substrate 708, formed, for example, from bulk silicon (Si) or silicon on insulator (SOI). In one example, the channel area of the pFET 704 region comprises a single base layer 722, formed, for example, from silicon germanium (SiGe) with a high germanium content deposited directly on the substrate 708. Deposited directly on the base layer 722 is a plurality of conducting layers $724_1$-$724_4$ (hereinafter collectively referred to as "conducting layers 724) and a plurality of sacrificial layers $726_1$-$726_3$ (hereinafter collectively referred to as "sacrificial layers 726"). The conducting layers 724 and the sacrificial layers 726 are arranged on the base layer 708 in an alternating manner, e.g., starting with a first conducting layer $724_1$ deposited directly on the base layer 708 and ending with a last conducting layer $724_4$. In one example, there are four conducting layers 724 and three sacrificial layers 726, although other numbers of layers are also possible.

The conducting layers 724 and the sacrificial layers 726 may be formed of different semiconductor materials. In one example, the conducting layers 724 comprise silicon that has been p-doped in situ, while the sacrificial layers 726 comprise silicon germanium.

A source 728 is positioned at one end of the conducting channel region, while a drain 730 is positioned at the opposite end of the conducting channel region. Spacers $732_1$-$732_2$ (hereinafter collectively referred to as "spacers 732") are positioned between the conducting channel region and each of the source 728 and the drain 730.

Referring to FIG. 7B, the sacrificial layers 714 of the nFET region 702 and the sacrificial layers 726 of the pFET region 704 are next removed, e.g., by wet and/or dry/plasma etching. This leaves the plurality of conducting layers 712 and 724 suspended between their respective sources 716 or 728 and drains 718 or 730. As discussed above, the plurality of conducting layers 712 and 724 may comprise silicon that has been n-doped or p-doped in situ.

Referring to FIG. 7C, the base layers 710 and 722 of the nFET region 702 and the pFET region 704, respectively, may be removed, e.g., by wet and/or dry/plasma etching.

Referring to FIG. 7D, a metal gate layers 734 and 736 may be deposited in the nFET region 702 and the pFET region 704, respectively, in a replacement metal gate (RMG) or gate-last process. As illustrated, the metal gate layers 734 and 736 fill in the spaces between the respective conducting layers 712 and 724 and surround the respective conducting layers 712 and 724. In one example, the metal gate layers 734 and 736 surround the respective conducting layers 712 and 724 on all sides, creating gate-all-around structures in both the nFET region 702 and the pFET region 704. The nFET region 702 has a second n-type threshold voltage (nVt2) that is higher than the first n-type threshold voltage nVt1 of the fifth FET 600 of FIGS. 6A-6D, while the pFET region 704 has a second p-type threshold voltage (pVt2) that is higher than the first p-type threshold voltage pVt1 of the fifth FET 600 of FIGS. 6A-6D.

A gate stack for a dual channel MOSFET (e.g., having an n-doped silicon channel in the nFET region and a p-doped silicon channel in the pFET region) such as the FET 700 illustrated in FIGS. 7A-7D may be fabricated in one of a plurality of manners. In a first example, a single work function gate stack can be fabricated between a pFET and an nFET to achieve two nFET threshold voltages and two pFET threshold voltages.

In a second example, dual work function gate stacks can be fabricated between a pFET and an nFET to achieve two workable nFET threshold voltages and two workable pFET threshold voltages, although a total of four nFET threshold voltages and four pFET threshold voltages are available.

Although various embodiments which incorporate the teachings of the present invention have been shown and described in detail herein, those skilled in the art can readily devise many other varied embodiments that still incorporate these teachings.

What is claimed is:

1. An apparatus, comprising:
   a conducting channel region comprising a plurality of conducting channels arranged in a spaced apart relation relative to each other;
   a source positioned at a first end of the conducting channel region;
   a drain positioned at a second end of the conducting channel region; and
   a gate stack surrounding all sides of the conducting channel region and filling in spaces between the plurality of conducting channels, wherein the gate stack comprises:
      a doped substrate;
      a metal doping layer deposited directly on the doped substrate, wherein the metal doping layer is formed from a dipole; and
      an adjustment oxide layer deposited directly on the metal doping layer,
   wherein the gate stack has a plurality of threshold voltages.

2. The apparatus of claim 1, wherein the apparatus is an n-type field effect transistor.

3. The apparatus of claim 2, wherein the plurality conducting channels is formed of silicon.

4. The apparatus of claim 3, wherein the silicon is n-doped.

5. The apparatus of claim 1, wherein the apparatus is a p-type field effect transistor.

6. The apparatus of claim 5, wherein the plurality of conducting channels is formed of silicon germanium.

7. The apparatus of claim 3, wherein the silicon germanium is p-doped.

8. The apparatus of claim 1, wherein the gate directly contacts the conducting channel region.

9. The apparatus of claim 1, wherein the plurality of threshold voltages comprises up to eight threshold voltages.

10. The apparatus of claim 2, wherein the substrate comprises silicon.

11. The apparatus of claim 10, wherein the metal doping layer comprises at least one of: lanthanum, ytterbium, magnesium, an oxide of lanthanum, an oxide of ytterbium, and an oxide of magnesium.

12. The apparatus of claim 10, further comprising:
   a layer of a first barrier metal deposited directly on the adjustment oxide layer;
   a layer of an n-type field effect transistor work function metal deposited directly on the layer of the first barrier metal; and
   a layer of a second barrier metal deposited directly on the layer of the n-type field effect transistor work function metal.

13. The apparatus of claim 5, wherein the substrate comprises silicon germanium.

14. The apparatus of claim 13, wherein the metal doping layer comprises at least one of: lanthanum, ytterbium, magnesium, an oxide of lanthanum, an oxide of ytterbium, and an oxide of magnesium.

15. The apparatus of claim 13, further comprising:
   a layer of a first barrier metal deposited directly on the adjustment oxide layer;
   a layer of a p-type field effect transistor work function metal deposited directly on the layer of the first barrier metal; and
   a layer of a second barrier metal deposited directly on the layer of the p-type field effect transistor work function metal.

16. An apparatus, comprising:
   an n-type field effect transistor, comprising:
      a first conducting channel region comprising a plurality of silicon channels arranged in a spaced apart relation relative to each other;
      a first source positioned at a first end of the first conducting channel region;
      a first drain positioned at a second end of the first conducting channel region; and
      a first gate stack surrounding all sides of the first conducting channel region and filling in spaces between the plurality of silicon channels, wherein the first gate stack comprises:
         a first doped substrate;
         a first metal doping layer deposited directly on the first doped substrate, wherein the first metal doping layer is formed from a dipole; and
         a first adjustment oxide layer deposited directly on the first metal doping layer; and a p-type field effect transistor, comprising:
- a second conducting channel region comprising a plurality of silicon germanium channels arranged in a spaced apart relation relative to each other;
- a second source positioned at a first end of the second conducting channel region;
- a second drain positioned at a second end of the second conducting channel region; and
- a second gate stack surrounding all sides of the second conducting channel region and filling in spaces between the plurality of silicon germanium channels, wherein the first gate stack comprises:
  - a second doped substrate;
  - a second metal doping layer deposited directly on the second doped substrate, wherein the second metal doping layer is formed from a dipole; and
  - a second adjustment oxide layer deposited directly on the second metal doping layer,
- wherein the apparatus has a plurality of threshold voltages.

17. The apparatus of claim 16, wherein at least some channels of the plurality of silicon channels are n-doped in situ, and at least some channels of the plurality of germanium channels are p-doped in situ.

18. The apparatus of claim 16, wherein the first gate directly contacts the first conducting channel region and the second gate directly contacts the second conducting channel region.

19. The apparatus of claim 16, wherein the plurality of threshold voltages comprises up to eight n-type threshold voltages and up to eight p-type threshold voltages.

* * * * *